(12) United States Patent
Joyner et al.

(10) Patent No.: US 7,058,246 B2
(45) Date of Patent: Jun. 6, 2006

(54) TRANSMITTER PHOTONIC INTEGRATED CIRCUIT (TXPIC) CHIP WITH ENHANCED POWER AND YIELD WITHOUT ON-CHIP AMPLIFICATION

(75) Inventors: Charles H. Joyner, Sunnyvale, CA (US); Fred A. Kish, Jr., Palo Alto, CA (US); Frank H. Peters, Cork (IE); Atul Mathur, Santa Clara, CA (US); David F. Welch, Menlo Park, CA (US); Andrew G. Dentai, Mountain View, CA (US); Damien Lambert, Sunnyvale, CA (US); Richard P. Schneider, Mountain View, CA (US); Mark J. Missey, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 429 days.

(21) Appl. No.: 10/267,346

(22) Filed: Oct. 8, 2002

(65) Prior Publication Data
US 2003/0081878 A1   May 1, 2003

Related U.S. Application Data

(60) Provisional application No. 60/328,207, filed on Oct. 9, 2001, provisional application No. 60/370,345, filed on Apr. 5, 2002, provisional application No. 60/392,494, filed on Jun. 28, 2002, provisional application No. 60/378,010, filed on May 10, 2002.

(51) Int. Cl.
*G02B 6/12*   (2006.01)
(52) U.S. Cl. .................. 385/14; 385/31
(58) Field of Classification Search ............ 385/14, 385/15, 19, 20, 27, 31, 37, 39
See application file for complete search history.

(56) References Cited

U.S. PATENT DOCUMENTS

| 4,114,257 A | | 9/1978 | Bellavance |
| 4,875,216 A | * | 10/1989 | Thornton et al. ............. 372/45 |
| 4,904,859 A | | 2/1990 | Goossen et al. .......... 250/211 J |
| 5,078,516 A | | 1/1992 | Kapon et al. ................ 385/129 |
| 5,394,489 A | | 2/1995 | Koch ........................... 385/14 |
| 5,418,183 A | | 5/1995 | Joyner et al. ................ 437/129 |

(Continued)

FOREIGN PATENT DOCUMENTS

EP   0472221 A2   2/1992

(Continued)

OTHER PUBLICATIONS

Sasaki et al., "Selective MOVPE Growth and Its Application to Semiconductor Photonic Integrated Circuits", Electronics & Comunications in JP, vol. 76(4), pp. 1-11, Apr. 1, 1993.

(Continued)

*Primary Examiner*—Daniel StCyr
(74) *Attorney, Agent, or Firm*—W. Douglas Carothers, Jr.

(57) ABSTRACT

A monolithic photonic integrated circuit (PIC) chip comprises an array of modulated sources providing a plurality of channel signals of different wavelengths and an optical combiner coupled to receive the channel signals and produce a combined output of the channel signals. The arrays of modulated sources are formed as ridge waveguides to enhance the output power from the respective modulated sources so that the average output power from the sources is approximately 2 to 4 times higher than in the case of comparable arrays of modulated sources formed as buried waveguides.

46 Claims, 9 Drawing Sheets

U.S. PATENT DOCUMENTS

| | | | |
|---|---|---|---|
| 5,450,431 A | 9/1995 | Glance et al. | |
| 5,521,742 A | 5/1996 | Ishimura | |
| 5,536,085 A | 7/1996 | Li et al. | 372/50 |
| 5,568,311 A | 10/1996 | Matsumoto | 359/344 |
| 5,631,768 A | 5/1997 | Bruno | 359/333 |
| 5,633,193 A | 5/1997 | Baillargeon et al. | 438/32 |
| 5,763,287 A | 6/1998 | Itagaki et al. | 437/126 |
| 5,784,183 A | 7/1998 | Aoki et al. | 359/124 |
| 5,790,580 A | 8/1998 | Sakata et al. | |
| 5,805,755 A * | 9/1998 | Amersfoort et al. | 385/131 |
| 5,889,906 A | 3/1999 | Chen | 385/28 |
| 5,891,748 A | 4/1999 | Sakata | 438/31 |
| 5,946,331 A | 8/1999 | Amersfoort et al. | 372/23 |
| 5,949,562 A | 9/1999 | Kubota et al. | 359/124 |
| 6,075,802 A * | 6/2000 | Stolz et al. | 372/46 |
| 6,104,516 A | 8/2000 | Majima | 359/181 |
| 6,117,753 A | 9/2000 | Hamamoto et al. | |
| 6,118,562 A | 9/2000 | Lee et al. | 359/124 |
| 6,141,477 A | 10/2000 | Kitamura | 385/131 |
| 6,148,017 A | 11/2000 | Borchert et al. | 372/50 |
| 6,162,655 A | 12/2000 | Johnson et al. | 438/31 |
| 6,174,748 B1 | 1/2001 | Jeon et al. | 438/31 |
| 6,201,824 B1 | 3/2001 | Hong et al. | |
| 6,245,144 B1 | 6/2001 | Bitner et al. | 117/104 |
| 6,256,330 B1 * | 7/2001 | LaComb | 372/46 |
| 6,261,857 B1 | 7/2001 | Alam et al. | 438/31 |
| 6,271,947 B1 | 8/2001 | Iannone et al. | |
| 6,274,398 B1 | 8/2001 | Bendz et al. | |
| 6,278,170 B1 | 8/2001 | Komatsu | 257/458 |
| 6,466,707 B1 | 10/2002 | Dawes et al. | 385/14 |
| 2003/0081878 A1 | 5/2003 | Joyner et al. | |
| 2003/0095736 A1 | 5/2003 | Kish, Jr. et al. | |
| 2003/0095737 A1 | 5/2003 | Welch et al. | |
| 2003/0099018 A1 | 5/2003 | Singh et al. | |
| 2004/0033004 A1 | 2/2004 | Welch et al. | |
| 2004/0067006 A1 | 4/2004 | Welch et al. | |

FOREIGN PATENT DOCUMENTS

| | | |
|---|---|---|
| EP | 1069456 A2 | 1/2001 |
| JP | 03120777 A1 | 5/1991 |
| WO | WO 00/52789 | 9/2000 |
| WO | WO 01/33287 | 5/2001 |

OTHER PUBLICATIONS

Zirngibl et al., "Digitally Tunable . . . Optical Amplifier", IEEE Photonics Technology Letters, vol. 6(4), pp. 516-518, Apr. 1994.

Amerfoort et al., "Compact Arrayed Waveguide . . . Bulk Active Material", vol. 33(25), pp. 2124-2125, Dec. 4, 1997.

Monnard et al., "Direct Modulation of a Multifrequency Laser Up to 16×622 Mb/s", IEEE Photonics Technology Letters, vol. 9(6), pp. 815-817, Jun. 1, 1997.

Joyner et al, "An 8-Channel . . . Selective-Area Epitaxy", IEEE Photonics Technology Letters, vol. 7(9), pp. 1013-1015, Sep. 1, 1995.

Young et al., "A 16×1 Wavelength . . . Electroabsortion Modulators", IEEE Photonics Technology Letters, vol. 5(8), pp. 908-910, Aug. 1, 1993.

Adams et al., "Mach-Zehnder . . . at 1.55 mm", vol. 32(5), pp. 485-486, Feb. 29, 1996.

Steinmann et al., "Asymmetric Quantum . . . Laser/Modulator", IEEE Photonics Technology Letters, vol. 9(2), pp. 191-193, Feb. 1, 1997.

Karunasiri et al, "Tunable Infrared . . . Step Quantum Wells", IEEE Electron Device Letters, vol. 11(5), pp. 227-229, May 1, 1990.

Amir Sa'ar et al., "Quantum Interference..Asymmetrical Quantum Wells", Vo. 33(9), pp. 1517-1526, Sep. 1, 1997.

H. Takeuchi et al., NRZ Operation at 40 Gb/s of a Compact Module Containing an MQW Electroabsorption Modulator Integrated with a DFB Laser, IEEE Photonics Technology Letters, vol. 9(5), pp. 572-754, May 1997.

M. G. Young, et al., "A 16×1 Wavelength Division Multiplexer with Integrated Distributed Bragg Reflector Lasers and Electroabsorption Modulators", IEEE Photonics Technology Letters, vol. 5(8), pp. 908-910, Aug. 1993.

M. Zirngibl, et al., "WDM Receiver by Monolithic Integration of an Optical Preamplifier, Waveguide Grating Router and Photodiode Array", Electronic Letters, vol. 31(7), pp. 581-582, Mar. 30, 1995.

Masaki Kohtoku, et al., "Polarization Independent Semiconductor Arrayed Waveguide Gratings Using a Deep-Ridge Waveguide Structure", IEICE Trans. Electron., vol. E81-C, No. 8, pp. 1195-1204, Aug. 1998.

Masaki Kohtoku, et al., "Packaged Polarization-Insensitive WDM Monitor with Low Loss (7.3 dB) and Wide Tuning Range (4.5)", IEEE Photonics Technology Letters, vol. 16(11), pp. 1614-1616, Nov. 1998.

Thomas L. Koch, et al., "Semiconductor Photonic Integrated Circuits", IEEE Journal of Quantum Electronics, vol. 27(3), pp. 641-653, Mar. 1999.

Charles H. Joyner, et al., "Low-Threshold Nine-Channel Waveguide Grating Router-Based Continuous Wave Transmitter", Journal of Lightwave Technology, vol. 17(4), pp. 647-651, Apr. 1999.

D. A. Ackerman, et al., "A Practical DBR Laser Based Wavelength Selectable DWDM Source", IEEE LEOS Newsletter, pp. 7-9, Oct. 2001.

R. A. Salvatore, et al., "Electroabsorption Modulated Laser for Long Transmission Spans", IEEE Journal of Quantum Electronics, vol. 38(5), pp. 464-476, May 2002.

J.B.D. Soole, et al., "Monolithic InP/InGaAsP/InP Grating Spectrometer for the 1.48-1.56 MM Wavelength Range", Applied Physics Letters, vol. 58(18), pp. 1949-1951, May 6, 1991.

M. Zirngibl, et al., "Polarization Independent 8×8 Waveguide Grating Multiplexer on InP", Electronics Letters, vol. 29(2), pp. 201-202, Jan. 21, 1993.

M.A. Newkirk, et al., "1.5 µm Multiquantum-Well Semiconductor Optical Amplifier with tensile and compressively Strained Wells for Polarization-independent gain", IEEE Photonics Technology Letters, vol. 4(4), pp. 406-408, Apr. 1993.

P. Doussiere, et al., "1.55 µm Polarization Independent Semiconductor Optical Amplifier with 25 dB Fiber to Fiber Gain", IEEE Photonics Technology Letters, vol. 6(2), pp. 170-172, Feb. 1994.

J.B.D. Soole, et al., "Polarization-Independent InP Arrayed Waveguide Filter Using Square Cross-Section Waveguides", Electronic Letters, vol. 32(4), pp. 323-324, Feb. 15, 1996.

H. Tanobe, et al., "Temperature Insensitive Arrayed Waveguide Gratings in InP Substrates", IEEE Photonics Technology Letters, vol. 10(2), pp. 235-237, Feb. 1998.

D. Wolfson, et al., "Detailed Theoretical Investigation of the Input Power Dynamic Range for Gain-Clamped Semiconductor Optical Amplifier Gates at 10 Gb/s", IEEE Photonic Technology Letters, vol., 10(9), pp. 1241-1243, Sep. 1998.

J. Sarathy, et al., "Polarization Insensitive Waveguide Grating Routers in InP", IEEE Photonics Technology Letters, vol. 10(12), pp. 1763-1765, Dec. 1998.

K. Nakamura, et al., "Buried Heterostructure DFB Laser Integrated With Ridge Waveguide Electroabsorption Modulator With Over 20 GHz Bandwidth", European Conference on Optical Communications (ECOC '97), vol. 448, pp. 175-178, 1997.

Thomas L. Koch et al., "Semiconductor Lasers for Coherent Optical Fiber Communications", *Journal of Lightwave Technology*, vol. 8(3), pp. 274-293 Mar., 1990.

Chung-en Zah et al., "Multiwavelength DFB Laser Arrays With Integrated Combiner and Optical Amplifier for WDM Optical Networks", *IEEE Journal of Selected Topics on Quantum Electronics*, vol. 3(2), pp. 584-597, Apr., 1997.

S. Menezo, et al., "10-Wavelength 200-GHz Channel Spacing Emitter Integrating DBR Lasers with a PHASAR on InP for WDM Applications", *IEEE Photonics Technology Letters*, vol. 11, No. 7, pp. 785-787, Jul. 1999.

Kudo et al., "1.55-μm Wavelength-Selectable Microarray DFB-LD's with Monolithically Integrated MMI Combiner, SOA, and EA-Modulator", *IEEE Photonics Technology Letters*, vol. 12(3), pp. 242-244, Mar. 2000.

D. Johnson et al., "Spot-Size-Converted Devices for Uncooled Passive Alignment", *IEEE LEOS Newsletter*, pp. 3-7, Aug. 2001.

Y. Suzaki et al., "Multi-Channel Modulation in a DWDM Monolithic Photonic Integrated Circuit", *14th Indium Phosphide and Related Materials Conference Conference Proceedings*, May 12-16, Stockholm, Sweden, Conference Proceedings, pp. 681-683.

C. H. Joyner et al., "An 8-Channel Digitally Tunable Transmitter with Electroabsorption Modulated Output by selective-Area Epitaxy", *IEEE Photonics Technology Letters*, vol. 7(9), pp. 1013-1015, Sep., 1995.

Kaminow et al., "Optical Fiber Telecommunications IIIB—Chapter 5—Semiconductor Laser Growth and Fabrication" by C. H. Joyner, pp. 179-186, Academic Press 1997.

M. Kohtoku et al., "InP-Based 64-Channel Arrayed Waveguide Grating with 50 GHz Channel spacing and up to -20dB Crosstalk"1786-1787, *Electronic Letters*, vol. 33(21), pp. , Oct. 9, 1997.

Steinmann et al., Asymmetric Quantum Wells with Enhanced QCSE: Modulation Behavior and Application for Integrated Laser/Modulator, *IEEE Photonics Technology Letters*, vol. 9(2), pp. 191-193, Feb. 1997.

Ken Morito et al., "A Low-Wavelength-Chirp, Low-Drive-Voltage MQW Modulator Integrated DFB Laser for 10 Gb/s Transmission", OPTOELECTRONICS-Devices and Technologies, vol. 10(1), pp. 89-96, Mar., 1995.

H. Yamazaki et al., "Low Drive Voltage (1.5 $V_{P.P.}$) and High Power DFB-LD/Modulator Integrated Light Sources by Bandgap Energy Controlled Selective MOVPE", Proceedings of the $21^{ST}$ European Conference on Optical Communication (ECOC '95)—Brussels), pp. 897-900, 1995.

* cited by examiner

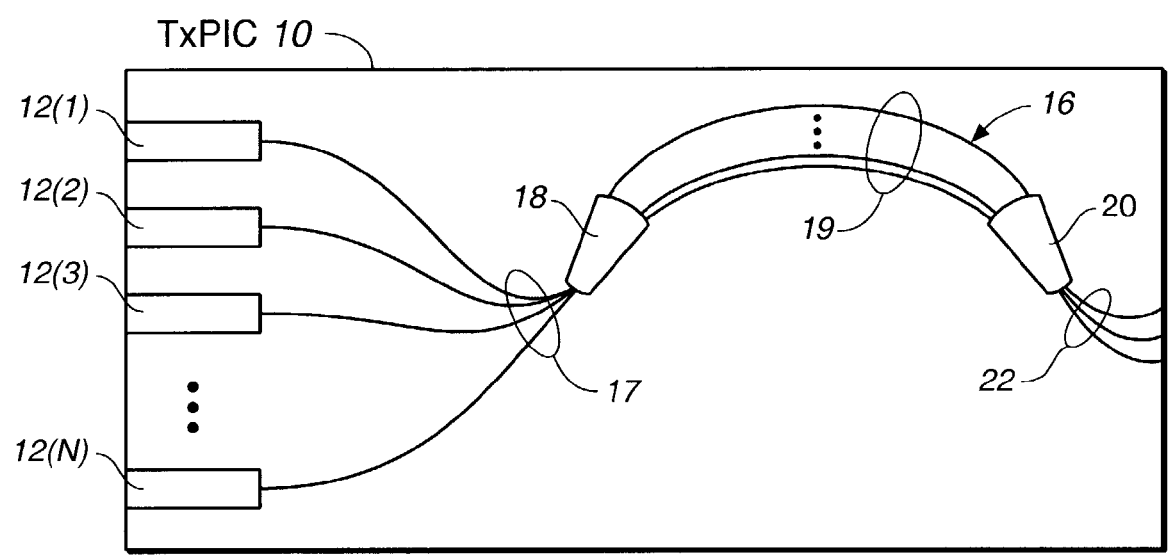
FIG._1

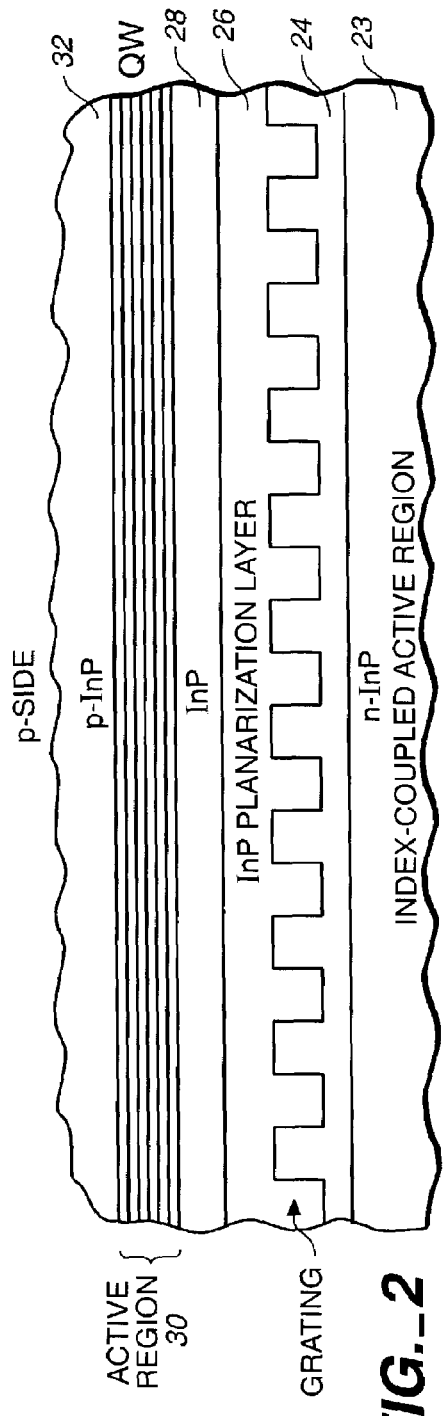
FIG._2
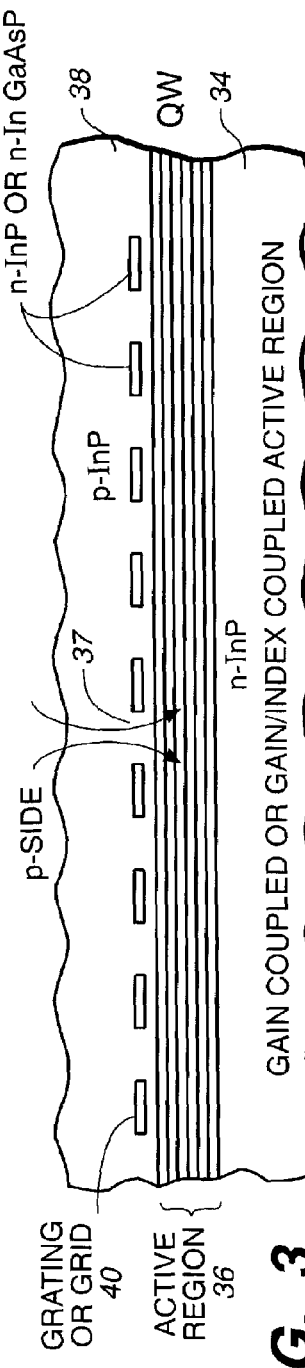
FIG._3
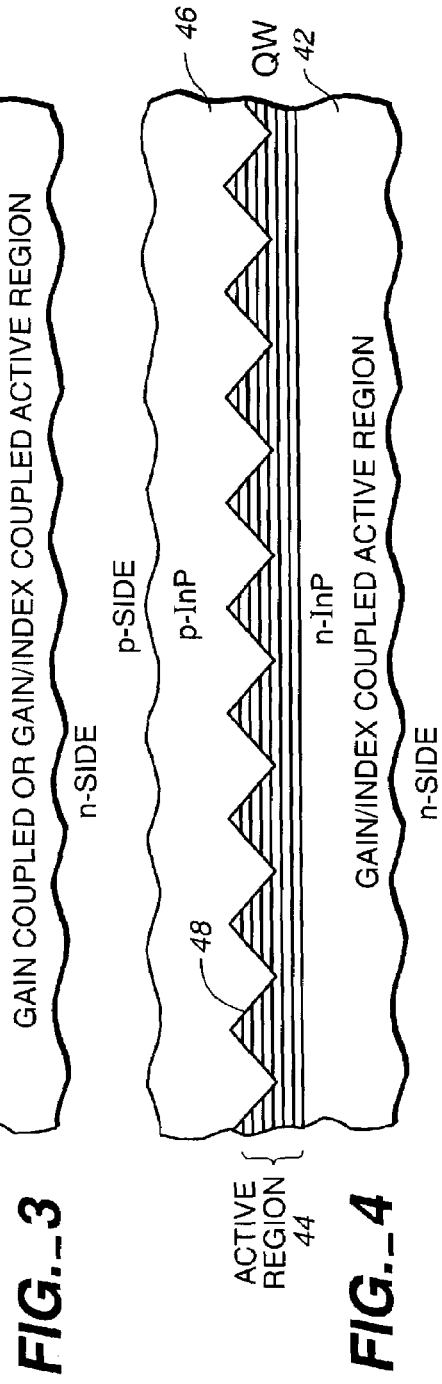
FIG._4

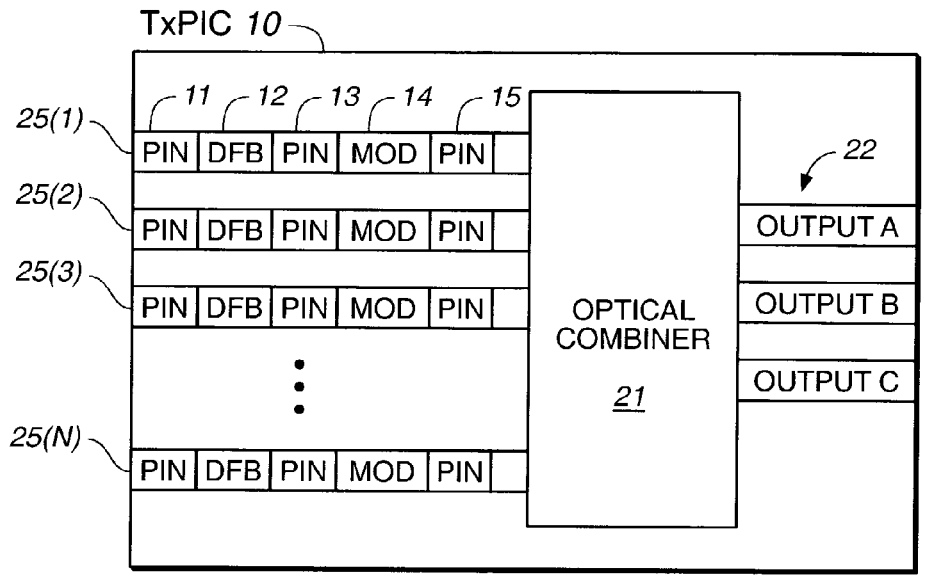
FIG._5
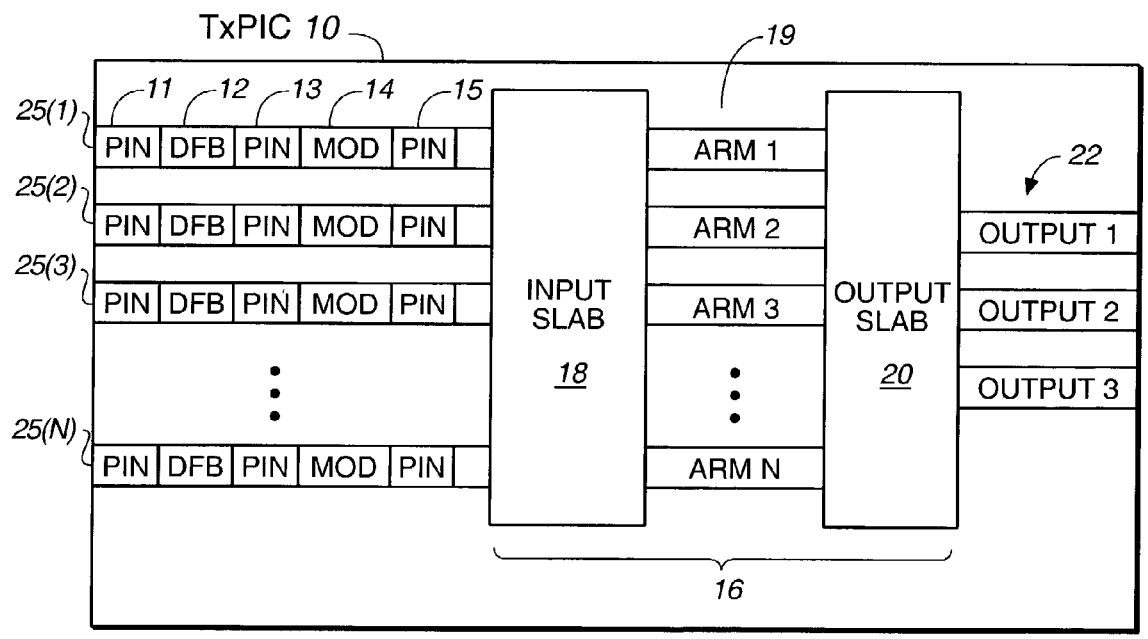
FIG._6

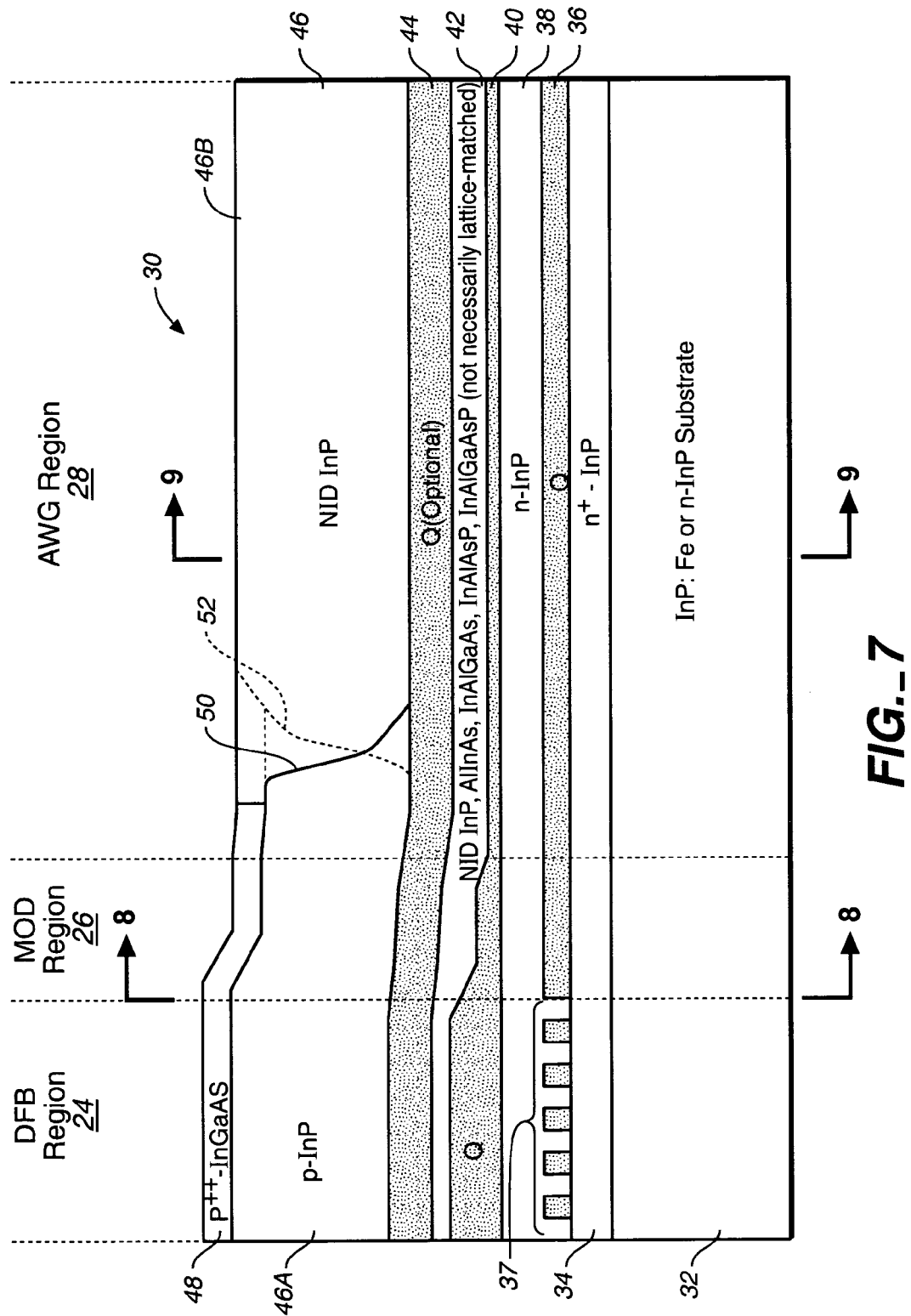
FIG._7

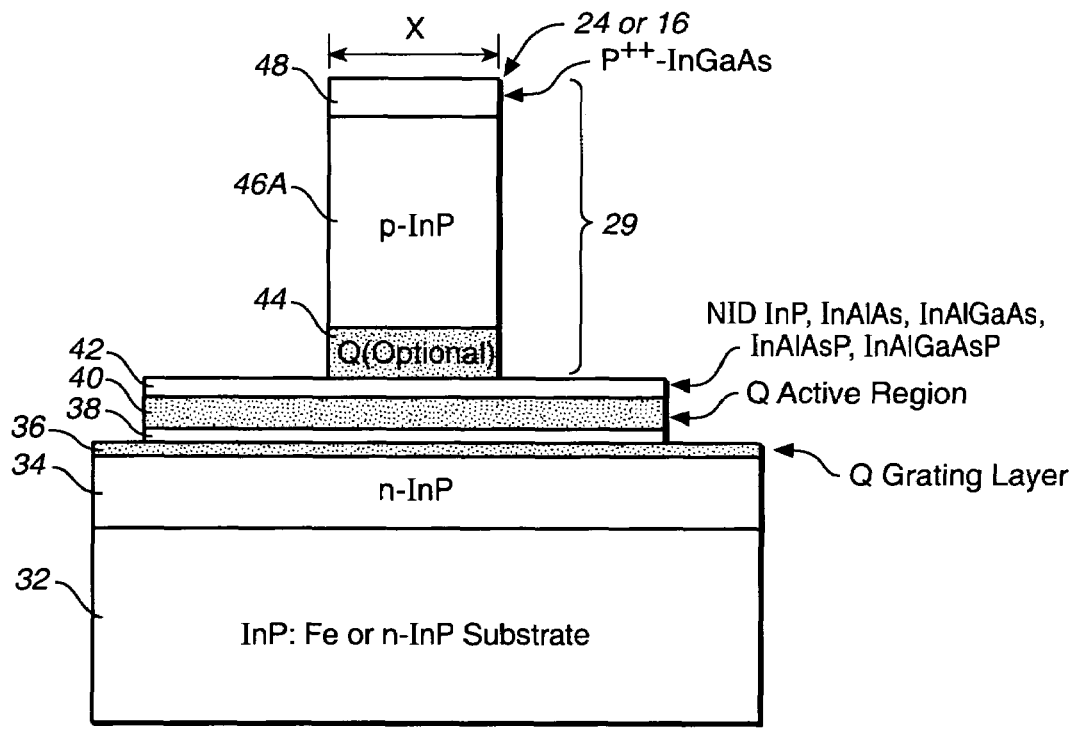
FIG._8
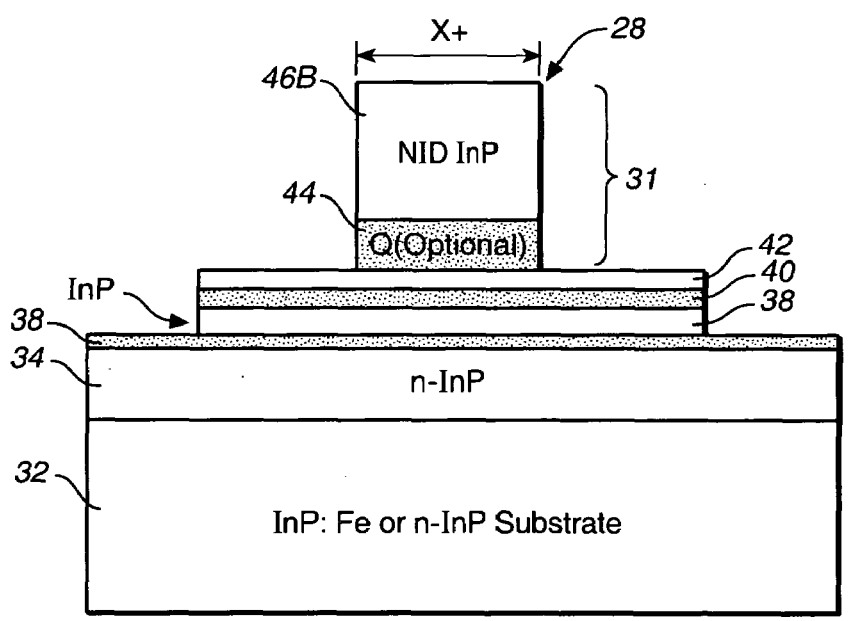
FIG._9

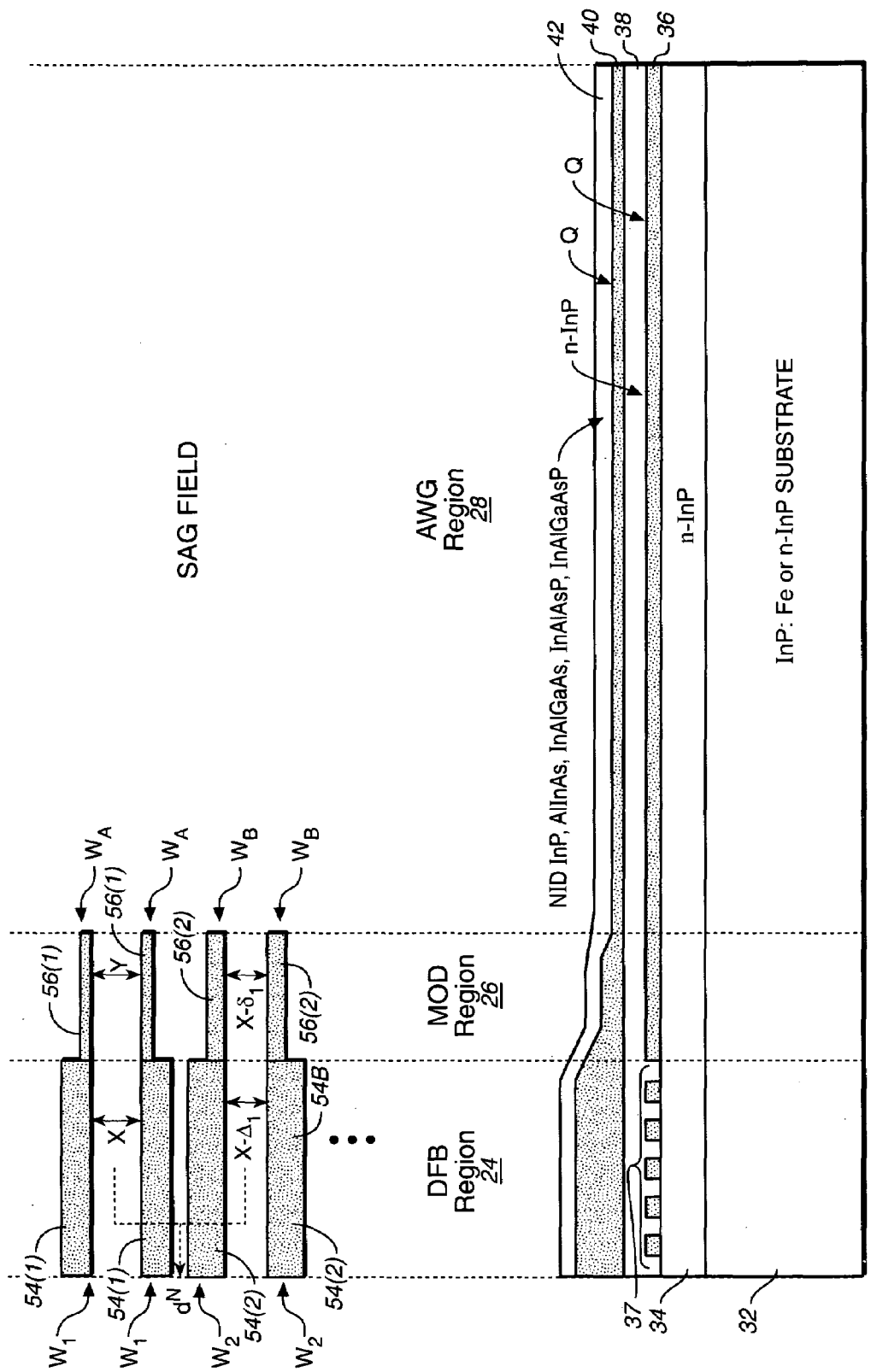
FIG._10

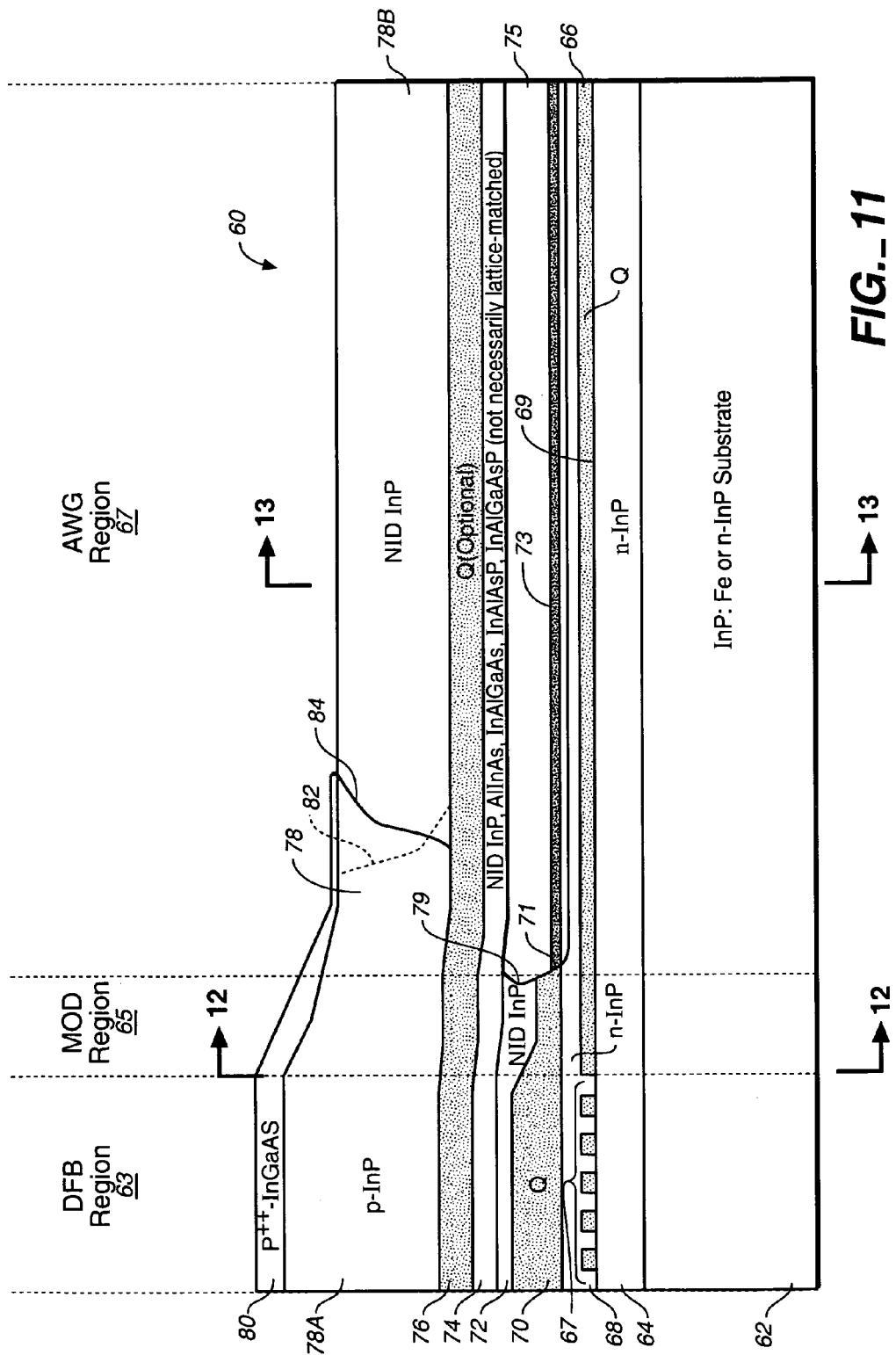
FIG._11

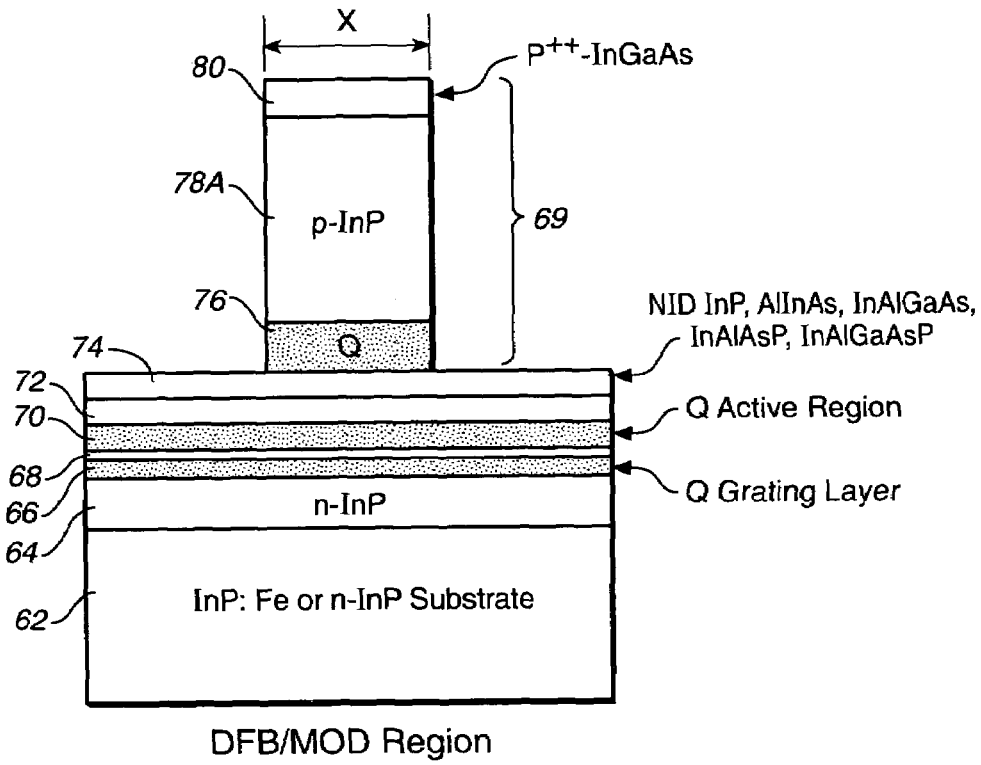
FIG._12
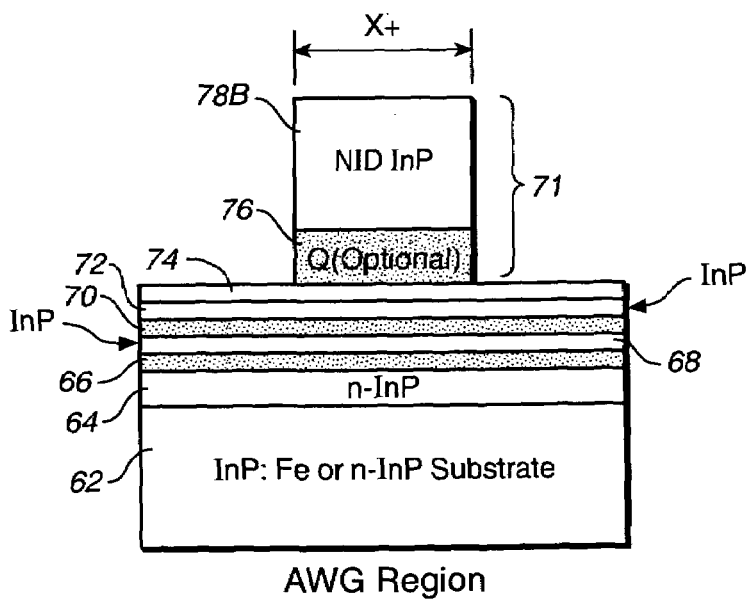
FIG._13

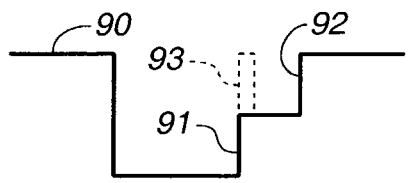
FIG._14A
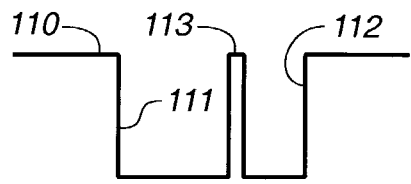
FIG._14F
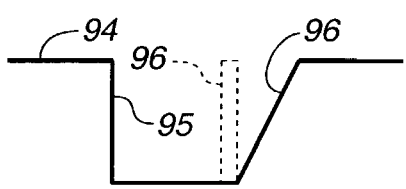
FIG._14B
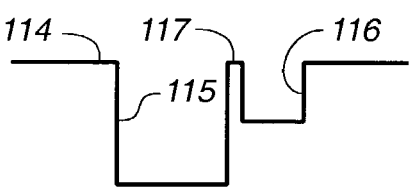
FIG._14G
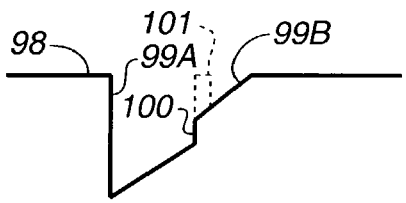
FIG._14C
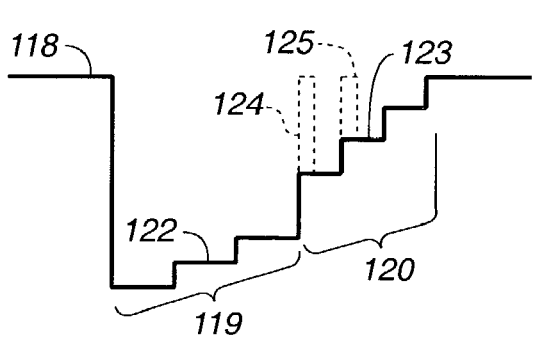
FIG._14H
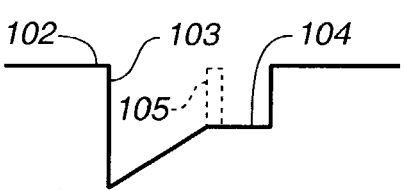
FIG._14D
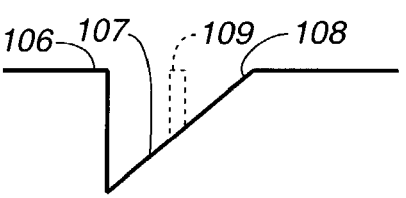
FIG._14E

TRANSMITTER PHOTONIC INTEGRATED CIRCUIT (TXPIC) CHIP WITH ENHANCED POWER AND YIELD WITHOUT ON-CHIP AMPLIFICATION

CROSS-REFERENCE TO RELATED APPLICATIONS

This nonprovisional application claims the benefit of priority of provisional applications, Ser. No. 60/378,010, filed May 10, 2002 and entitled, TRANSMITTER PHOTONIC INTEGRATED CIRCUIT (TXPIC) CHIP WITH ENHANCED POWER AND YIELD WITHOUT ON-CHIP AMPLIFICATION; Ser. No. 60/328,207, filed Oct. 9, 2001 and entitled, PHOTONIC INTEGRATED CIRCUITS FOR DWDM OPTICAL NETWORKS, now U.S. nonprovisional patent application Ser. No. 10/267,331, filed Oct. 8, 2002 and entitled. TRANSMITTER PHOTONIC INTEGRATED CIRCUITS (TxPIC) AND OPTICAL TRANSPORT NETWORKS EMPLOYING TxPICs; Ser. No. 60/370,345, filed Apr. 5, 2002 and entitled, WAVELENGTH STABILIZATION IN TRANSMITTER PHOTONIC INTEGRATED CIRCUITS (TxPICs), now U.S. nonprovisional patent application, Ser. No. 10/267,330, filed Oct. 8, 2002 and entitled, TRANSMITTER PHOTONIC INTEGRATED CIRCUIT (TxPIC) CHIP ARCHITECTURES AND DRIVE SYSTEMS AND WAVELENGTH STABILIZATION FOR TxPICs; Ser. No. 60/392,494 filed Jun. 28, 2002 and entitled DIGITAL OPTICAL NETWORK ARCHITECTURE, now U.S. nonprovisional patent application, Ser. No. 10/267,212, filed Oct. 8, 2002 and entitled, DIGITAL OPTICAL NETWORK ARCHITECTURE all of which are owned by the assignee herein and are incorporated herein by their reference.

BACKGROUND OF THE INVENTION

1. Field of the Invention

This invention relates generally to photonic integrated circuits (PICs) and more particularly to optical transmitter photonic integrated circuit (TxPIC) chips having on-chip arrays of modulated light sources, not requiring additional on-chip amplification components.

2. Description of the Related Art

As used throughout this description and the drawings, the following short terms have the following meanings unless otherwise stated:

AWG—Arrayed Waveguide Grating.
BCB—benzocyclobutene or derivatives thereof.
DBR—Distributed Bragg Reflection Laser.
DEMUX—A Demultiplexer.
DFB—Distributed feedback Laser.
EA or EAM—Electro Absorption or Electro Absorption Modulator.
EML—Electro-optic Modulator/Laser.
ER—Extinction Ratio.
GC-SOA—Gain Clamped Semiconductor Optical Amplifier.
ITU Grid—Wavelengths and frequencies used in WDM systems that have been standardized on a frequency grid by the International Telecommunications Union (ITU).
MMI—Multimode Interference.
MOCVD—Metalorganic Chemical Vapor Deposition or organometallic vapor phase epitaxy.
MOD—Modulator.
MUX—A Multiplexer.
NA—Numerical Aperture.
NID—Not Intentionally Doped.
PD—Photodiode
PIC—Photonic Integrated Circuit.
Q—A Group III-V quaternary comprising InGaAsP or InAlGaAs.
QW—Quantum Well.
RxPIC—Receiver Photonic Integrated Circuit.
SAG—Selective Area Growth usually performed in MOCVD.
SOA—Semiconductor Optical Amplifier.
SSC—Spot Size Converter—sometimes called also a mode adaptor.
TxPIC—Transmitter Photonic Integrated Circuit.
Wavelength Grid—Wavelengths and frequencies in a periodic or aperiodic frequency grid whether a standardized grid or not.

There exists a great demand at this time that future generations of optical transmitters and optical receivers or optical transceivers for optical telecommunications to be much more cost effective than present optical telecommunication equipment that comprise optical discrete optical components that are separately manufactured, assembled and packaged. It is clear that a solid approach to achieve this goal is a photonic integrated circuit (PIC) that includes, in monolithic form, the integrated arrays of active electro-optic components and optical passive components, i.e., multiple signal channels within a standardized grid where each channel includes a modulated source (which may comprise either a directly modulated laser or a laser and an external modulator, sometimes referred to as a semiconductor modulator/laser (SML), e.g., an EML) coupled to an optical combiner. It has been suggested that transmitter photonic integrated circuits (TxPICs) comprise, in monolithic form, a laser (which may be tunable), and electro absorption modulator (EAM), such as shown in the articles of Thomas L. Koch et al. entitled, "Semiconductor Photonic Integrated Circuits", *IEEE Journal of Quantum Electronics*, Vol. 27(3), pp. 641–653, March, 1999 and D. A. Ackerman et al. entitled, "A Practical DBR Laser based Wavelength Selectable DWDM Source", *IEEE LEOS Newsletter*, pp. 7–9, October, 2001; DFB laser arrays and EA modulator arrays such as shown in U.S. Pat. Nos. 5,891,748 and 5,784,183; DBR laser arrays, EA modulators, optical combiner and output amplifier on a single chip such as shown in the article of M. G. Young et al. entitled, "A 16X1 Wavelength Division Multiplexer with Integrated Distributed Bragg reflector Lasers and Electroabsorption Modulators", *IEEE Photonics Technology Letters*, Vol. 5(8), pp. 908–910, August, 1993. Also, there is the article of Charles H. Joyner et al., entitled, "Low-Threshold Nine-Channel Waveguide Grating Router-Based Continuous Wave Transmitter", *Journal of Lightwave Technology*, Vol. 17(4), pp. 647–651, April, 1999 disclosing a single monolithic optical chip, i.e., a photonic integrated circuit (PIC), having a plurality of semiconductor optical amplifiers (SOAs) with their optical outputs coupled via a plurality of passive waveguides to an AWG to form a multiple wavelength laser source having multiple established laser cavities between these coupled optical components. To be noted is that there is an absence in the art, at least to the present knowledge of the inventors herein, of an integrated laser source array, such as in the form of a DFB array, and an optical combiner in the form of an array waveguide grating (AWG). A principal reason is that it is difficult to fabricate, on a repeated basis, an array of DFB lasers with a wavelength grid that matches the wavelength grid of the AWG. Also, as the numbers of electro-optic components are added to a PIC chip, insertion losses increase requiring that some on-chip or off-chip optical signal amplification is included.

It has been suggested that receiver photonic integrated circuits (RxPICs) comprise, in monolithic form, ridge waveguide, arrayed waveguide gratings (AWGs) and an array of photodetectors as shown in the articles of Masaki Kohtoku et al. entitled, "Polarization Independent Semiconductor Arrayed Waveguide Gratings Using a Deep-Ridge Waveguide Structure", *IEICE Trans. Electron.*, Vol. E81-C, No. 8, pp 1195–1204, August, 1998 and "Packaged Polarization-Insensitive WDM Monitor with Low Loss (7.3 dB) and Wide Tuning Range (4.5), *IEEE Photonics Technology Letters,* Vol. 16(11), pp. 1614–1616, November, 1998. Another example is the article of M. Zirngibl et al. entitled, "WDM receiver by Monolithic Integration of an Optical Preamplifier, Waveguide Grating router and Photodiode Array", *ELECTRONIC LETTERS,* Vol. 31(7), pp. 581–582, Mar. 30, 1995, discloses a 1 cm by 4 mm PIC chip, fabricated in InP, that includes the integrated components comprising an optical amplifier (SOA) optically coupled to an AWG DEMUX having a plurality of different signal channel outputs each coupled to a respective photodiode (PD) in an array of on-chip photodiodes. The SOA boosts the multiplexed input channel signals. The AWG DEMUX demultiplexes the signals into separate channel signals which signals are respectively detected by a PD in the array.

As indicated above, many of the above mentioned PIC devices include an on-chip optical amplifier to boost the power of optical channel signals generated by or received in the PIC, such as a SOA or an optical laser amplifier. These added gain components are useful to enhance the power of the channel signals especially where on-chip insertion loss exceeds the insertion loss budget allowed in the design of such PIC chips. However, the presence of additional active optical components, while solving gain needs, provides additional constraints on the resulting PIC chip thermal budget through the requirement of additional PIC operating power which translates into higher PIC heat generation and required dissipation. Also, the addition of a plurality of SOAs on the TxPIC chip tightens what we term the selective area growth (SAG) budget where the wavelengths of the active/waveguide core of the DFBs, EA modulators and added SOAs, for example, must be monotonically shifted via SAG processing. This results in the bandgap in each consecutive optical component in an optical waveguide formed in the PIC to be optimized for performance. For example, the wavelength of the AWG waveguide region is less than the wavelength of the MOD active region which is less than the wavelength of the DFB active region which is less than the wavelength of the SOA active region ($\lambda_{AWGi} < \lambda_{MODi} < \lambda_{DFBi} < \lambda_{SOAi}$ where $\lambda_{DFBi+1} = \lambda_{DFBi} + \Delta\lambda$, $\lambda_{MODi+1} = \lambda_{MODi} + \Delta\lambda$, $\lambda_{SOAi+1} = \lambda_{SOAi} + \Delta\lambda$ and $\lambda_{AWG} << \lambda_{MODi}$). $\Delta\lambda$ is the channel spacing. Note that it is possible to vary the wavelength spacing $\Delta\lambda_1$ across the array in a proprietary PIC system.

Also, the presence of SOAs on a monolithic PIC chip increases fabrication and test complexity. Their deployment on the TxPIC side (versus the RxPIC side) can add to unwanted dispersive effects on the transmitted waveform or may otherwise degrade the signal transmission properties. An SOA may amplify the optical reflections between integrated components, resulting in increased and undesireable-undesirable back reflection. Further, the addition of on-chip SOAs increases the stress on the available SAG budget, albeit it may be only a same percentage of the total budget, such as around 10%. The SAG budget may be defined as the range of attainable operating wavelengths with sufficient wavelength separation to enable the proper wavelength targets for totally all optical components or devices on the chip. It would be preferred to reserve the SAG budget for DFB laser wavelength budget or for the DFB/MOD wavelength budget by reducing the number of optical components on the chip, in particular, eliminating any need for on-chip SOAs making it easier to optimize the DFB array performance/yield or the DFB/MOD performance/yield or DFB/MOD/MUX performance/yield. Further, the elimination of SOAs from the PIC chip renders it also possible to increase the density of DFBs included on a single semiconductor chip, which translates into an increase in the number of signal channels per TxPIC chip, reducing the cost per channel for a PIC transmitter module.

OBJECTS OF THE INVENTION

It is an object of the present invention to improve the output performance and quality of PIC chips for employment in optical transport networks.

It is another object of this invention to provide a TxPIC that does not require or need on-chip amplification.

SUMMARY OF THE INVENTION

According to this invention, a monolithic PIC chip comprises an array of modulated sources providing a plurality of channel signals of different wavelengths and an optical combiner coupled to receive the channel signals and produce a combined output of the channel signals. The arrays of modulated sources are formed as ridge waveguides to enhance the output power from the respective modulated sources so that the average output power from the sources is approximately 2 to 4 times higher than in the case of comparable arrays of modulated sources formed as buried waveguides.

A TxPIC chip, as disclosed, comprises an array of modulated sources, preferably DFB lasers and optically coupled EA modulators, with the modulated outputs of the coupled to an integrated optical combiner, preferably an arrayed waveguide grating (AWG), from which the multiplexed output is presented at a facet output for optical coupling to an optical transport network or optical telecommunication system. The DFB lasers and EA modulators are optimized for highest output power, with improved chirp and extinction ratio as well as minimized insertion loss at the modulator, so that any need for on-chip signal amplification, such as a semiconductor optical amplifier (SOA), or a semiconductor optical laser amplifier or GC-SOA is eliminated.

A feature of this invention is the elimination of need for on-chip amplifiers in TxPIC chips, such as SOAs or GC-SOAs, which has the advantages of eliminating (1) the need of another integrated optical component on the chip, (2) additional metal contacts needed to operate the on-chip amplifier, (3) additional on-chip heat generated by the on-chip amplifier, (4) the requirement of blueshift of the active region of the on-chip lasers, and (5) waveform distortion induced by the amplifiers. On-chip amplification is accomplished by providing a higher power DFB lasers or a DFB laser plus MOD array which is accomplished by deploying a ridge waveguide structure. On-chip power levels of 5 dBm are obtainable from the chip EMLs which is sufficiently high as not to require an on-chip amplifier such as an SOA. Further note that the DFB lasers may also be preferably replaced with DBR lasers that are either directly modulated or externally modulated.

A further feature of this invention is the employment of SAG growth techniques in forming the core waveguide region of the AWG multiplexer and over the entire area of optical active components on the TxPIC chip, and employing masks to create the active components, such as the fabrication of arrays of semiconductor laser sources and/or modulators and an AWG multiplexer. The deployment of a single SAG mask over the area of the DFB/MOD/AWG region or DFB/.AWG throughout the InP wafer makes it possible to epitaxially grow appropriate bandgaps and corresponding operational wavelengths in the respective core waveguides (Q layers comprising InGaAsP or AlInGaAs or multiple quantum well layers and barriers of such quaternaries) across the DFB or DFB/MOD arrays in a single epitaxial growth step using MOCVD. The deployment SAG is extended to the field of the AWG region of the TxPIC as well as the DFB or DFB/MOD regions. SAG performed in the core waveguide may be accomplished with a quaternary (Q) in the InP regime, such as, InGaAsP or AlInGaAs. Again, note that DBR lasers may be substituted for DFBs in the above description. Another feature of this invention is the provision of an optical butt joint between the laser/modulator regions verses the AWG multiplexer region of the chip to allow even tighter control of the modulator structure by only using the SAG techniques to create the DFB region from the modulator (MOD) QW region.

Another feature of this invention is the provision of a core waveguide comprising AlInGaAs in the employment of SAG. AN extension of this feature is the utility of AlInGaAs at an optical butt joint formed in the core waveguide at the interface between an AWG and MOD of a TxPIC chip.

Another feature of the TxPIC embodiments disclosed is the provision of a ridge waveguide structure employed throughout the entire waveguide network fabricated in the PIC for the optically coupled components such as arrays of modulated sources, (e.g., DFBs and/or MODs) optically coupled to an AWG. The ridge waveguide structure is preferred compared to the buried waveguide structures where for example, the active/waveguide core is buried between current blocking layers, such as InP:Fe. The ridge waveguide structure provides for lower confinement of the optical mode and is roughly three to four times larger in cross-sectional area compared to the mode in buried waveguide structures, which translates into more optical power available in the TxPIC chip as well as provided from the TxPIC chip. The ridge waveguide type PIC is employed throughout the entire PIC optical waveguide structure enabling higher chip yield (for example, as much as 50% or more yield) over buried waveguide type PICs as well as providing lower optical confinement to achieve higher on-chip optical power. The improved yield in the ridge structure results from improved ability to control the modal index in a ridge DFB or DBR source as well as the elimination of a low yield undercut etch that is required for buried structures. Further, by employing different ridge widths for the optical components on the PIC, the waveguide width of the DFB and EAM structures can be optimized for higher output power and the EA modulator structures can be optimized for higher extinction ratios. As an example, the ridge waveguide structures in the laser regions may have, in one approach, a narrower width than the ridge waveguide structures in the MOD regions where both the laser sources and the modulators have the same cross-sectional profile. In another approach, the laser sources may have a shallower ridge waveguide and the modulator sources have a deeper ridge waveguide, reference being made here to a resulting height of the ridge, and with both ridges having the same cross-sectional profile. Furthermore, the AWG or optical combiner may have a ridge height that is the same or different from that of the laser and/or modulator. The ridge height of the AWG is optimized for at least one of low-insertion loss, low back reflection (between the combiner and the modulated source), and center channel alignment of the combiner (if it is wavelength selective) to the modulated source array grid.

Another feature of this invention is an InP-based TxPIC chip comprising an array of DFB lasers coupled to an AWG where the DFB lasers are directly modulated with data signals and are provided with improved transient chirp characteristics through the employment of gain-coupled or gain/index coupled active/waveguide regions. Furthermore, a gain-coupled structure may provide for lower optical mode confinement, and hencedhence improved optical power. The enhanced stability facilitated by the gain coupling allows the lasers to be driven at a higher output power without incurring reduced performance due to chirping of the transmitted signal. Note that any of the gain coupled active regions desribeddescribed above may be substituted with loss-coupled regions or gain+loss coupled regions. Further, optical mode confinement may be further lowered by also providing the DFB lasers with a ridge waveguide structure. The success of integrating an array of DFB lasers having different operational wavelengths with an AWG MUX on a single chip is the employment of controlled bandgap shifting techniques, e.g.,. SAG growth techniques, over the entire area of the TxPIC chip.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a schematic plan view of a first embodiment of a TxPIC chip comprising an integrated array of directly modulated DFB lasers coupled to an AWG.

FIG. 2 is a schematic side view of a first embodiment of an index-coupled active region that may be utilized in the DFB lasers of FIG. 1.

FIG. 3 is a schematic side view of a second embodiment of a gain/index-coupled active region that may be utilized in the DFB lasers of FIG. 1.

FIG. 4 is a schematic side view of a third embodiment of a gain/index-coupled active region that may be utilized in the DFB lasers of FIG. 1.

FIG. 5 is a schematic plan view of a first embodiment of a TxPIC chip comprising an integrated array of DFB lasers, modulators and optional sets of PIN photodetectors coupled to an optical combiner.

FIG. 6 is a schematic plan view of a second embodiment of a TxPIC chip comprising an integrated array of DFB lasers, modulators and optional sets of PIN photodetectors coupled to an AWG.

FIG. 7 is a schematic longitudinal side sectional view of a first embodiment showing one of the integrated DFB lasers and EA modulators coupled to an AWG of a TxPIC chip.

FIG. 8 is a schematic lateral cross-sectional view taken along the line 8—8 of FIG. 7.

FIG. 9 is a schematic lateral cross-sectional view taken along the line 9—9 of FIG. 7.

FIG. 10 is a schematic longitudinal side sectional view of the first embodiment of the TxPIC chip shown in FIG. 7 at an earlier stage of fabrication employing selective area growth (SAG) to form the waveguide core of the DFB lasers, EA modulators and AWG.

FIG. 11 is a schematic longitudinal side sectional view of a second embodiment showing one of the integrated DFB lasers and EA modulators coupled to an AWG of a TxPIC chip.

FIG. 12 is a schematic lateral cross-sectional view taken along the line 12—12 of FIG. 11.

FIG. 13 is a schematic lateral cross-sectional view taken along the line 13—13 of FIG. 11.

FIG. 14A–14H show a series of bandgap diagrams of multiple quantum well structures that may be employed in the EA modulators in any of the foregoing embodiments.

DETAILED DESCRIPTION OF THE INVENTION

Reference is now made to FIG. 1 which discloses an InP-based semiconductor TxPIC 10 chip comprising, in monolithic form, a plurality of directly modulated DFB lasers 12(1) . . . 12(N) with their outputs 17 optically coupled to input slab 18 of to an optical combiner, shown here in the form of an arrayed waveguide grating (AWG) 16. AWG 16 comprises input slab or free space region 18 and output slab or free space region 20 between which are a plurality of waveguide gratings 19, all of which is known in the art. The output of AWG 16 is preferably a vernier output where more than one output 22 is provided from the center region of the first order Brillouin zone output of AWG 16. The vernier output 22, as indicated, is greater than one output, preferably equal to or greater than three different outputs, from output slab 20 of AWG 16 so that one of the outputs can be selected having an optimum AWG wavelength grid of aligned grid wavelengths. Thus, through the selection of the best vernier output 22 in the primary Brillouin zone of AWG 20, the best wavelength grid alignment relative to a standardize wavelength grid of all of the DFB laser outputs at 17 can be selected that has optimized wavelength matching with lowest losses and requiring minimal thermal tuning of TxPIC 10.

DFB lasers 12(1) . . . 12(N) of TxPIC chip 10 of FIG. 1, as well in the other embodiments herein, may number, for example, from four to forty or more such devices integrated on the chip. These devices are all fabricated employing selective bandgap shifting techniques (e.g., SAG processing) so that the resultant operating wavelength of each consecutive laser is a wavelength on a standardized wavelength grid, such as the ITU grid, or their wavelengths can be a non-standardized periodic or aperiodic wavelength grid. If the SAG process is utilized, the processing can encompass multiple SAG steps for large element arrays. Each DFB laser 12 is directly modulated to provide a modulated output signal to AWG 16 where the separate signal wavelengths are combined (multiplexed) and placed on outputs 22 from AWG 16. Note that other selective bandgap shifting techniques may also be employed to vary the wavelength across the array (and possibly in the AWG or combiner regions). These selective bandgap shifting techniques include disordering (also known as layer intermixing) or multiple regrowths (forming butt joints across the array or along a single channel). Disordering may be implemented by a variety of methods, including impurity-induced layer disordering, vacancy-enhanced layer disordering, or implantation (defect) enhanced layer disordering. If disordering is employed in the AWG or optical combiner region, it is preferably does not introduce significant impurities into the materials that form optical waveguides. This preference is dictated that impurities can act as optical absorption centers, increasing the propagation loss in the passive structure. Furthermore, care must be taken to ensure that dislocations are not introduced in the PIC materials during the disordering process, resulting in degraded performance and reliability. Note that any of the aforementioned bandgap shifting techniques may be used solely or in concert with each other throughout this invention.

InP-based TxPIC chip 10 may include DFB lasers 12 having an index-coupled active region, such as illustrated in FIG. 2, comprising an-InP confinement layer 23, a grating layer 24 comprising, for example, a InGaAsP or InAlGaAs quaternary grating layer 24, followed by an InP planarization layer 26, which is followed by an active region 30 comprising a plurality of quantum well and barrier layers of semiconductor compounds such as InGaAsP or InAlGaAs quaternary compounds. Hereinafter, such InGaAsP or InAlGaAs quaternary compound layers are also referred to as "Q" or "Q layer" or "Q layers". AAnn active region is epitaxially deposited confinement layer 22 of p-InP. It should be noted that the distal thickness between quantum well (QW) active region 30 and grating layer 24 in FIG. 2 should be sufficiently large so that the grating is only index coupled to the active region. The distance may, for example, be approximately in the range of about 1200 angstroms to about 1700 angstroms or a little greater than this amount. This active region structure of FIG. 2 as well as subsequently discussed Group III–V semiconductor structures are epitaxially grown employing MOCVD as is well known in the art.

In order to improve the transient chirp characteristics of directly modulated DFB lasers 12(1) . . . 12(N), a gain coupled active region, shown in FIG. 3, or an index/gain coupled region, shown in FIGS. 3 and 4, may be utilized instead of an index coupled active region, shown in FIG. 2. In FIG. 3, the semiconductor structure for the active region includes, as an example, an n-InP confinement layer 34, a Q active region 36 comprising multiple quantum wells and barriers, and a p-InP layer 38 which has an embedded grating or grid 40 of n-InP or, for example, n-InGaAsP, p-InGaAsP or NID-InGaAsP. Grid 40 comprises a Group III–V compound material, e.g., n-InP periodic regions except of opposite conductivity to layer 38, and is provided within p-InP layer 38 forming a gain-coupled grating or grid so that current flows between the n-InP grid regions into active region 36. The periodic current flow regions 37 between the grids induce a periodic index change along the length of active region 36. If these periodic grid or gratings 40 are, instead, a higher index compound material, e.g., n-InGaAsP, p-InGaAsP or NID-InGaAsP, then the current flow between grid regions 40, versus InP regions 38, into active region 36 induces a periodic index change (lower index) along the length of active region 36 as well as an effective periodic index change (higher index) in the refractive index in active region 36 between the current flow regions 37 forming a gain/index coupled region.

An alternate index/gain coupled structure is shown in FIG. 4 comprising n-InP confinement layer 42, Q active region 44 formed with a saw-tooth grating 48 and p-InP confinement layer 46. Saw-tooth grating 48 is formed in the higher index active regions (e.g., InGaAsP quantum wells and barriers) includes a planarization layer 46 of p-InP to bury grating 48 so that periodic gain and index coupled active region is formed. See, as an example, the active region structure in U.S. Pat. No. 5,536,085 which is incorporated herein by its reference. In either case of gain coupled or gain/index coupled active regions shown in FIGS. 3 and 4, an enhanced transient chirp characteristic is achieved in the modulation of DFB lasers 12. In the case of a gain-coupled active region, shown in FIG. 3, the active region can be fabricated with one less epitaxial growth step because, in an index-coupled structure, a second epitaxial growth step is necessary to planarize the grating whereas the planarization and upper confinement layer growth can be performed in the same epitaxial step. Also, a purely gain-coupled region, as shown in FIG. 3, provides for lower optical confinement which translates into higher power output from DFB lasers 12. Also note that the enhanced laser stability provided by gain coupling (or gain/index coupling) facilitates that ability to drive the laser to higher powers, facilitating a TxPIC that does not require on-chip amplification. A further advantage of gain-coupled DFBs is that they break the mode degeneracy of the Bragg modes in the DFB lasers resulting in enhanced single-mode operation and narrow linewidth without the need to introduce a phase shift in the grating. Note that for any of the descriptions above, gain-coupling may be substituted or combined with loss coupling to achieve the same effect as gain coupling. In this application, we define complex coupling as the coupling that involves either gain or loss coupled structures, either solely, in combination with each other and/or index-coupling.

Reference is now made to FIGS. 5 and 6 which show InP-based TxPIC chips having on-chip cw operated DFB lasers12 and on-chip electro-optic modulators 14 forming an array of EMLs comprising a plurality of integrated optical waveguide signal channels 25(1) . . . 25(N). The principal optical components comprise an array of DFB lasers 12, an array of EA modulators 14 and an optical combiner 21 which in FIG. 5 may be comprised of a multimode interference (MMI) coupler, an Echelle grating, a star coupler or an arrayed waveguide grating (AWG). As a combiner, however, a wavelength selective combiner is preferred such as AWG 16, shown specifically in FIG. 6. An AWG multiplexer is preferred because of its low optical loss in performing a multiplexing function. The optical combiner in FIG. 5 comprising an AWG, star coupler, Echelle low loss grating or a MMI coupler is preferably provided with a vernier output 22 as previously explained. Also, optional arrays of photodiodes (PDs) 11, 13 and 15, for example, in the form of PIN photodiodes, may be provided at the back at 11 and/or front at 13 of each of the DFB lasers 12 and/or at the output of the EA modulators at 15 to respectively monitor the DFB power, the operating output wavelengths of DFB lasers 12 for purpose of wavelength stabilization and or to monitor the output intensity of EA modulators 14 as well as their extinction ratio (ER) or test their saturation output power, such as under test performance, and/or operating conditions. Also, to be noted is that photodetectors 15 at the output of EA modulators 14 may alternatively be selectively forward (reversed) biased to provide for gain (loss) equalization of output power across the wavelength grid or 15 may also be alternatively or additionally positioned between each DFB laser and EA modulator, as is the case of photodiodes 13, rather than after each EA modulator 14. Further, the use of PIN photodetectors at both locations 13 and 15 would allow for a larger dynamic range of output power equalization.

An important aspect of the TxPICs of FIGS. 5 and 6 is that these photonic circuit structures are fabricated to provide for low optical confinement of the propagating mode which provides for high power from each DFB/MOD channel 25(1) . . . 25(N) on the TxPIC. This lower confinement is brought about by providing a ridge waveguide along the entire optical waveguide paths formed in the PIC as illustrated in the embodiments of FIGS. 7–9 and 11–13, as will be evident from the following description of those embodiments. Also, the ridge waveguide for the DFB region may be different, such as narrower width, than the width of the ridge waveguide of the MOD region providing for higher power, and the ridge waveguide width at the DFB region may be narrower than that of the AWG region providing for lower optical confinement of the mode in the DFB region. In another approach, the laser regions may have a narrower width than the ridge waveguide structures in the MOD regions where both the laser sources and the modulators have the same cross-sectional profile. In a further approach, the laser sources may have a shallower ridge waveguide and the modulator sources have a deeper ridge waveguide, reference being made here to ridge height, with both regions having a similar cross-sectional profile except that the former is not as tall as the latter.

In yet a further embodiment, the ridge of the AWG may be deeper than the DFB ridge. This facilitates improved mode confinement for decreased bend losses as well as reduced insertion losses of the optical combiner (e.g., AWG). Ridge-waveguides are also a preferred for the laser array as a result of their improved fabrication tolerances for realizing a multi-wavelength DFB array with accurate wavelength spacing. See, for example, U.S. Pat. No. 5,805,755.

It should be noted that the teaching of this invention differs from that of U.S. Pat. No. 5,805,755 which teaches the combination of a directly modulated ridge-waveguide DFB array in combination with a buried ridge star-coupler combiner. In this patent, the ridge-waveguide DFB array is utilized for improved wavelength accuracy wherein a buried heterostructure passive waveguide is utilized for low-bend losses. The buried-ridge was utilized as a result of the desire of the inventors to realize low bend losses in a buried heterostructure passive waveguide structure. Hence, the disclosure of U.S. Pat. No. 5,805,755 combines precise DFB wavelength control (via ridge-waveguides) with low-bend loss buried heterostructure passive structures. However, the structures of patent '755 do not realize a high-performance, high-yield TxPIC. A passive buried heterostructure waveguide has numerous disadvantages. Low-loss combiners require very stringent control of the critical dimension and placement of the waveguides entering and exiting the optical combiner. As disclosed in patent '755, buried heterostructure waveguides do not provide accurate control of the width or etch profile, and hence they exhibit significant variations in control and reproducibility of the critical dimension of the waveguide as well as the placement of the waveguides around the input and output ports of the optical combiner. This results in higher insertion loss and variations as in insertion loss across the combiner channels. In the case of wavelength-selective coribiners, the lack of control of the critical dimension and placement of the waveguides also makes it difficult to control the center wavelength of the combiner and the channel spacing of the grid of wavelengths that the combiner accepts. Thus, the performance as well as the yield (cost) of such structures is significantly compromised. The present invention provides for a low-loss passive ridge waveguide (with acceptable bend losses) that can be integrated with a DFB and/or an EA modulator. Low-loss optical combiners, such as, AWGs, have been fabricated with a total insertional loss of 6 dB for a 10 channel combiner. The utilization of a ridge structure in the optical combiner (or AWG region) in concert with a ridge structure in the DFB (and optional modulator region) facilitates the minimization of back-reflection between these elements, minimizing the chirp of the modulated source.

Furthermore, the ridge-waveguide optical combiner facilitates lower insertion loss, better channel-channel uniformity in the optical combiner as well as better center channel control and channel spacing control for wavelength-selective combiners. Thus, the ridge-waveguide structure is preferred for a high-power, highly accurate (wavelength), modulated sources that can be used in combination with highly accurate (wavelength) low-loss combiners that provide minimal reflection for improved chirp and extended transmission distances.

Reference is now made to FIGS. 7–9 which illustrate a cross-section of a preferred embodiment for one optical channel of TxPIC 30 shown in FIG. 6 except that none of the optional photodiodes 11, 13 and 15 are included in the PIC structure for purposes of simplicity of understanding. In FIGS. 7–9, TxPIC 30 comprises an n-InP type or semi-insulating (InP:Fe) substrate 31 upon which is epitaxially grown an n-InP buffer layer (not shown), an n-InP confinement layer 34, followed by a Q grating layer 36. At this point, the first epitaxial growth step is complete. A DFB grating 37 is formed in the Q grating layer 36 in region 24, as conventionally known and carried out in the art, followed by the commencement of a second epitaxial growth step of an n-InP planarization layer 38. It should be noted that DFB grating 37 may also be formed in the active region or close to the active region or above in a rib-loaded region. Next, a SAG mask is provided over the entire chip (or in essence over the InP wafer) wherein the SAG mask comprises a mask set for each in-wafer chip region, part of which is shown in the top of FIG. 10 which will be explained in more detail later. Then, in a single epitaxial growth step with the SAG mask in place, an active region/waveguide core 40 (Q1.5) comprising multiple quantum wells and barriers, such as, for example, between 4 to 6 quantum well/barrier pairs plus optional separate active region confinement layers, is selectively grown via the SAG mask set for the combined DFB/MOD/AWG regions. Next, an optional NID layer 42 of InP, AlInAs, InAlGaAs, InAlAsP, or InAlGaAsP (or multiple layer combination thereof), which functions as a stop etch layer, is epitaxially grown. This layer may also be selectively removed over the DFB regions. This is then followed by a further optional Q layer 44 (Q1.3) which will function as a rib-loaded layer in a ridge waveguide in the final structure. This is followed by the growth of a relatively thick p-InP cladding layer 46 having a thickness in the range, for example, of about 1 µm to 2 µm, followed by the epitaxial growth of a contact layer 48 of $p^{++}$-InGaAs as known in the art. After the growth of contact layer 48, the region of contact layer 48 and p-confinement layer 46 formed over AWG region 28 etched away, preferably over the entire region to position at 50 at the interface with MOD region 26, employing a wet etch (isotropic), a dry etch (anisotropic) or a combination dry and wet etch as are all well known in the art. Q layer 44 functions as an etch stop layer. The reason for etching away the p-InP in the region 46B is that it is heavy doped, such as $10^{18}$ cm$^{-3}$, so that this deposited layer will be highly light absorbing in passive AWG region 28 which is undesirable. This is especially true where the output of the AWG includes a spot size converter (SSC) or mode adaptor section. In this case, the propagating mode in the form of the multiplexed channel signals is expanded to better fit the NA of an optical fiber, for example, which may be coupled to a selected output of TxPIC 30.

A last epitaxial growth is then performed over AWG region 28, the DFB/MOD regions 24 and 26 being masked to prevent growth on these surfaces, such as a SiO$_x$ mask. The growth over AWG region 28 is a NID-InP 46B layer having a thickness such as in the range of about 1 µm to 2 µm. The remaining portion 46A of layer 46 remains in DFB and MOD regions 24 and 26. As previously explained above, the reason for regrowth over AWG region 28 is that p-InP layer 46 in this region is absorbing to propagating channel signals so that the regrowth with an undoped InP layer eliminates or otherwise substantially suppresses this absorption. However, it is possible for NID-InP layer 46B to also be lightly doped, especially n-type, or composite doped, e.g., NID-InP closer to Q waveguide layer 44 and n or p doped further away from the optical mode. Note that the layer 46B may alternatively comprise other transparent, low-index semiconductor materials, including InAlAs, or Q with a refractive index lower than that of layer 44. The surface of the in-wafer PIC may then be passivated by deposition of a layer of Si$_x$N$_y$, BCB, SiO$_x$, SOG, or polyimide.

It should be noted that, instead of the removal of a portion of the heavy doped confinement layer 46 at 46B, extending to 50, the epitaxial growth of layer 46 may be deposited as NID-InP. After growth of layer 46, the portion of NID-InP layer 46 over active device regions 24 and 26 may be selectively etched away to the point indicated at dotted line 52, after which a layer 46A of p-InP is deposited followed by contact layer 48, with AWG region 28 being masked, such as with SiO$_2$, during this epitaxial deposition.

As is well known in the art, the conductivity type of the layers comprising the PIC structure may be reversed so that the structure would start with a p-InP or InP:Fe substrate 32.

With reference to FIGS. 8 and 9, which respectively illustrate cross sections of the (DFB/MOD) integrated active component regions 24 and 26 and the passive (AWG) integrated component region 28, a ridge waveguide comprising plural optical channel waveguide paths formed on the PIC are selectively etched to form the rib-loaded, ridge waveguide structures comprising signal channel ridge waveguide 29 in regions 24 and 26 and ridge waveguide structures 31 in AWG region 28 as shown in these figures. In etching the ridge waveguides 29 and 31, NID layer 42 functions as a stop etch layer. Q layer 44 above the active region forms the load rib for waveguides 29 and 31. The utility of rib loaded waveguides 29 and 31 is that optical mode in the signal channels are more weakly confined compared, for example, to a buried waveguide structure, so that the output intensity of the DFB/MOD active devices is enhanced. The propagating mode will extend into the ridge as well as outside the ridge waveguide into the semiconductor bulk where higher order modes will be lossy. However, the rib-loading provides increased confinement of the optical wave relative to a shallow ridge-waveguide (without a rib). The rib thus provides a compromise to allow better confinement than in a shallow-ridge (for improved bending loss in passive elements) and reduced confinement in the active elements for higher output power. Note that for all the embodiments described herein, the rib-loaded layer is optional in all the embodiments. Depending on the details of the device structure, the ridge waveguide without layer 44 may function as well as or better than ridge waveguide structures with layer 44. Note that other index loading structures may also be utilized in the ridge as well (either above or below the active layer). The lower optical mode confinement offered by the ridge-waveguide types of structures in general provides a sufficient increase in power that on-chip SOAs are generally not necessary or required for many applications. It should be understood the lower confinement of the optical mode can be achieved without the rib-loaded layer. In fact, the lowest DFB confinement can be achieved and, hence, highest potential for output power from the DFB by utilizing a ridge waveguide structure without employment of a rib-loading layer 44.

It should be noted that the embodiments herein are not limited to a rib-loaded type or the non-rib-loaded type of ridge waveguides structures as well as any other type of ridge waveguide structure known in the art may also be deployed in the embodiments herein which enhance the intensity of the fundamental mode of the channel signals.

It should be further noted that the width of the ridge waveguides 31 in the AWG region 28 (FIG. 9) may be wider than the ridge waveguide width in the DFB/MOD regions 24 and 26 (FIG. 8) so that the optical mode confinement in the DFB/MOD region is lower to permit the attainment of higher output powers in these regions. It is not necessary that the confinement be as high as in the AWG region 28. Also, the width of the ridge waveguide 29 for the DFB laser region 24 may be different than the width at the MOD region 26 in order to vary the optical confinement between those two active regions, particularly for the purpose of providing for lower optical mode confinement in the DFB region to enhance its power capabilities. Also, in addition, one or more sets of the as-grown quantum well/barrier layers may be selectively etched away in the active region of the DFB lasers for lowering its optical mode confinement to increase DFB output power. This etching step takes place before the deposition of stop etch layer 42. Note that the ridge-structure of the AWG of FIG. 9 facilitates low-loss passive waveguides with propagation losses less than 2 dB/cm a small bending losses (less than 1 dB/90 degrees for about 500 to 700 μm radius of curvature). Note that the bending losses may be further reduced by increasing the stripe width (compared to the low-confinement DFB region) and varying the etch depth compared to the DFB region. The bending radius is sufficiently small that the resultant Tx PICs fabricated from such structures are approximately 25 mm$^2$ for a 12-channel TxPIC with the functionality shown in FIGS. 1 and 6. For channel counts in what we refer to as a moderate range, i.e., the range of 10–40 channels in a PIC, the size of the TxPIC chips is primarily governed by the number of array elements (channels) on the chip and not the size of the combiner. Thus, the approximately a 500 to 700 μm radius of curvature passive ridge-waveguides do not significantly compromise device size (cost) and provide enhanced (not degraded) performance insertion loss and passband characteristics compared to buried-ridge waveguides in such devices.

As a still further note, the use of the Q comprising InAlGaAs in the active region/waveguide core 40 formed via SAG processing across the TxPIC chip in lieu of InGaAsP provides for better bandgap uniformity across the wafer and in-wafer chips, better DFB laser structures due to better carrier confinement and transport properties and better modulator performance due to reduced hole "pile-up" and reduced valence band offsets as well as potentially better quantum well interfaces for enhanced modulator/DFB performance. In the use of a Q layer comprising InGaAsP, the nonuniformity of growth across the wafer can vary as much as 10 nm to 20 nm in wavelength shift. The reason is that, in the MOCVD reactor, the flow of constituent gases over the wafer, particularly, arsine and phosphine, these gaseous constituents crack at different temperatures relative to the flow of these gases at the center of a wafer compared to their flow at the outer edges of the wafer within the MOCVD reactor. Arsine cracks at a lower temperature compared to phosphine. As a result, the P:As ratio in the deposited Q layers across the wafer will not be uniform. Therefore, the employment of a Q compound comprising InAlGaAs with SAG processing for the active/passive waveguide region for a DFB/MOD/AWG structure provides for improved device performance. Also, for similar reasons, targeting of the optical PIC component wavelengths from run to run is improved.

Thus, in summary, better uniformity of deposited InAlGaAs is achieved principally due to the lack of P in the Q compound. The cracking temperature of $PH_3$ is sufficiently different than $AsH_3$ in the MOCVD process that it is difficult to achieve high compound uniformity of InGaAsP particularly over a large surface area of an InP wafer. Also, the employment of a Q Al-bearing layer provides for potentially improved interface abruptness between the quantum wells in the quantum well stack, leading to improved DFB and modulator performance. Furthermore, InAlGaAs offers better electron confinement for improved DFB performance and reduced hole pile-up and valence band offsets in the quantum wells of the EA modulator core 40 providing for improved EA modulator performance.

Reference is now made to FIG. 10 illustrating the selective area growth or SAG mask set employed over the wafer for forming the multiple active regions for both the DFB regions 24 and the MOD regions 26, in particular, in the fabrication of TxPIC chips 30. SAG is well established in the art and comprises the employment of masks for both active device regions 24 and 26 as shown in FIG. 10. The mask comprises pairs of $SiO_2$, $Si_3N_4$, or other such mask stripes 54, 56, etc., one set for each active region device, i.e., mask sets 54(1), 54 (2), etc. across the DFB region 24 and mask sets 56(1), 56(2), etc. across the MOD region 26. These mask pairs form a space between the mask stripes that constitutes the growth area or layer. As the mask width, such as widths $W_1$, $W_2$, etc., and $W_A$, $W_B$, etc., are sequentially made larger as, for example, the masking openings X, X–$\Delta_1$, etc., and Y, Y–$\delta_1$; etc. become sequentially smaller, so that the growth rate of the semiconductor layer formed within the mask openings between pairs of mask stripes becomes larger.

Monotonic increase, itself, of the mask widths will render the deposited material bandgap to be narrower and, correspondingly, the operating wavelength of formed regions in the mask openings become progressively longer. Monotonic decrease, itself, of the openings between mask pairs will render the bandgap narrower and, correspondingly, the operating wavelength of the formed regions in the mask openings become progressively longer. The decrease in bandgap occurs as a result of both enhanced In concentration and enhance growth rate in the mask openings. Thus, a combination of monotonic increasing of mask widths with a monotonic decrease in mask set openings will provide a monotonic decrease in bandgap and, correspondingly, the operational wavelength of formed regions in the mask openings will monotonically increase along the plurality of mask set openings. It is best that both of these parameters are monotonically changed together to progressively increase the operational wavelengths across the arrays of DFB lasers and MODs because either too large of a mask width or a too narrow width of mask set openings by themselves will not successfully achieve the desired wavelength grid across the arrays. However, with a properly designed simulation program, the progression of designed and set wavelengths of the fabricated DFB array can be achieved to match the operational wavelengths of a standardized wavelength grid, such as the ITU grid. Note that the operational wavelength of the DFBs is governed by a number of other factors in addition to the bandgap and thickness of the SAG region, including the grating pitch, composition and duty cycle as well as the ridge-waveguide width and etch depth. However the SAG bandgap and thickness are two of the larger factors that determine the operational wavelength of the DFB. After TxPIC chip fabrication, any necessary changes to operational wavelengths of any of the respective DFB laser sources in the TxPIC array can be adjusted or tuned by changes in the laser operating current or applied bias and/or changes in the laser operating temperature as described in more detail in U.S. application Ser. No. 10/267,330, filed Oct. 8, 2002, which is incorporated herein by its reference.

It should be noted that other combinations can be utilized relative to the monotonic progression in changes of mask widths and/or mask openings. For example, the mask openings can be made progressively or monotonically larger (X, $X+\Delta_1$, $X+\Delta_2$, etc., and Y, $Y+\delta_1$; $X+\delta_2$, etc.) across the DFB/MOD arrays and/or the mask widths can be made monotonically smaller (e.g., $W_1 > W_2 > W_3$, etc. and $W_A > W_B > W_C$, etc.).

The $d^N$, the center pitch of the active region mask pairs, as illustrated in FIG. 10, may be in the range of 100 μm to about 500 μm, preferably about 200 μm to about 350 μm. Furthermore, the In/Ga or In/Al ratio increases as the mask widths $W_1 \ldots W_N$ and $W_A \ldots W_M$ become monotonically larger. This is because the growth source materials diffuse laterally along the surface of the $SiO_2$ mask and laterally in the MOCVD gas phase over the mask and as the mask width becomes larger, the amount of such lateral diffusion becomes larger, providing more deposited material, in particular, In, in the mask opening and forming a thicker deposited layer and, correspondingly, the bandgap becomes smaller. In this connection, it should be noted that In molecules in the gas phase during MOCVD processing diffuse more rapidly, laterally across the mask than do Ga or Al molecules. So, as the thickness of quantum wells formed in active region 40 becomes larger due to monotonically increasing of mask widths (or, for that matter, also due to the monotonically decreasing of mask openings), the lattice distortion (compressive strain) becomes larger and the transition energy of the well becomes smaller. Furthermore, the bandgap becomes smaller which is dictated by the In/(Al+Ga) ratio.

In summary, then, SAG is a process where different widths of paired mask stripes and different opening widths between the pair of mask stripes change the thickness of the Group III–V alloy composition deposited in the mask openings thereby changing the bandgap of the as-grown compound formed in the array of mask openings. The thicker the as-grown SAG layer, the more In that is deposited into the mask opening which means a longer wavelength material.

Changes in the thickness of the various active regions (wells and barriers) grown for an array of active devices having progressively varying mask widths and/or openings for growth provides for varying thickness and bandgaps forming a series of progressively wavelength-shifted active regions capable of generating different lasing wavelengths which can be selectively provided to be within a standardized wavelength grid. The pairs of mask sets for MOD region 26 have progressively increasing widths as well as openings Y, $Y-\delta_1 \ldots$, designed to have the layers in region 26 to have smaller thicknesses with larger bandgaps (shorter wavelengths) for transparency to DFB generated light. As a specific example, the core bandgap of the Q core 40 in the DFB region 24 for the longest operational wavelength may correspond to about 1.58 μm whereas, in this case, in the MOD region 26 may be a core bandgap corresponding to about 1.52 μm, and in the case of the field of AWG region 28 may have a core bandgap corresponding to about 1.38 μm. In the field region of the mask where the AWG is fabricated, the bandgaps are further larger for the same region. Thus, a feasible SAG budget is limited to a range of selective bandgaps achievable within the constraints of the widths of the mask surfaces, $W_1$, $W_2$, $W_A$, $W_B$, etc. and their opening spacing X, $X-\Delta_1$, etc., Y, $Y-\delta_1$, etc as well as those governed by the limits of the strain/thickness that can be accommodated in the crystal. The inclusion of additional active or passive optical components, such as, an array of SOAs, puts further constraints on the SAG budget. Thus, it can be seen that if SAG budget can be reserved for bandwidth in the formation of additional channel wavelengths on a TxPIC chip, this provides for more effective cost savings in the manufacture and sale of a TxPIC module for use by carrier service providers. Also, the process control and yield of a TxPIC may be improved by a design that does not require the maximum attainable SAG budget to be utilized.

To be noted is that the SAG budget is extended into the field of the AWG. This will also limit the SAG budget. In the ideal case, the quantum wells in DFB region 24 are compressively strained. But, at best, in a design that utilizes a single SAG growth to deposit the core active/passive waveguide regions, i.e., core 40, including AWG region 28, the modulator quantum wells in core 40 will likely be unstrained or heavily tensely strained which means, in the context of this description, unstrained, slightly tensile strained or slight compressively strained, such as within a range of about <+2,000 ppm strained from the lattice constant. As a result, it is difficult to achieve, within the SAG budget and process, a tensile strained modulator active region 26 between a tensile strained AWG waveguide region 28 and a DFB compressively strained active region 24. If EA modulator quantum well region 26 is not tensile strained, there is a constraint on the EA modulator performance relative to chirp, extinction ratio and insertion loss. This desired balance in strain between the three different regions can be made easier by the provision of an additional growth step in forming the waveguide core 40 in AWG region 28 from the growth step employed to prepare the SAG growth for the quantum well active regions 24 and 26 of the DFB and modulator arrays. This also enhances the SAG budget for the design of the bandgaps to be utilized in the latter active regions, i.e., the range is extended for additional SAG grown layers of different bandgap.

In connection with the foregoing discussion, reference is made to FIGS. 11–13 showing another embodiment where there are additional processing steps of an etchback and epitaxial regrowth over AWG region 67 in order to provide relief in distributed strain among the DFB/MOD/AWG regions so that waveguide core through these regions way be desirably left with the most preferred structure for optimized performance in the MOD region 65, which may optimally consist of being tensile strained, or nominally strained compensated. TxPIC comprises the epitaxial growth on InP:Fe or n-InP substrate 62, n-InP buffer layer (not shown), followed by n-InP confinement layer 64 and a grating layer 66. At this point, as in the case of the previous embodiment the first epitaxial growth is complete and a DFB grating 67 is formed in DFB region 63 across the chip. This is followed by the second epitaxial growth comprising planarization layer 68, followed by deposition of a SAG mask and a subsequent epitaxial deposition of the Q core or active waveguide region 70 comprising multiple quantum wells and barriers of InGaAsP or AlInGaAs (including quantum confinement layers), followed by NID-InP layer 72. Note that in this case, the amount of SAG shift required is significantly reduced as the SAG is utilized to SAG shift wavelength across the array as well as the SAG shift between the DFB and modulator. The former shift is typically about 15 to 30 nm and the latter shift is approximately 30 to 70 nm. The SAG shift across the AWG may be about 150 nm. Thus, the requisite SAG shift is approximately 45 to 100 nm. This is substantially smaller than the SAG shift of the device of FIG. 7 wherein shifts greater than 200 nm are typically required. Although it provides a very convenient and useful means of shifting the composition and thickness of the quantum wells, SAG makes control of the composition and thickness of the material deposited around the mask regions more difficult. This difficulty increases with the amount of SAG shift. Thus, a structure with minimal SAG shift is desired to maximize composition and thickness variations in the DFB and MOD regions. This is essential to maximize MOD performance and yield as well as to control the DFB wavelength across the array. During the SAG epitaxial growth step (the third epitaxial growth step in this embodiment), the appropriate strain requirements, relative SAG growth and mask set openings and mask widths, are imposed only at DFB region 63 and MOD region 65 with disregard of the bandgap requirements for AWG region 67. This is because the core region 70 in region 67 will be later removed. Thus, the requirements for strain and bandgap budget can be limited to the growth of core 70 in The DFB and MOD regions 63 and 65. In the preferred case, the Q core 70 in DFB region 63 is compressively strained whereas, in the MOD region 65, the core 70 is slightly compressively strained, lattice-matched or tensely strained. At this time, a selective etch is performed over region 67 to remove Q core layer 70 and InP layer 72 in that region. The depth of the etchback is minimized to limit the amount of later regrowth. As shown in FIG. 11, the etchback may extends at 69 into planarization layer 68 but this depth is minimized. Alternatively, a stop etch may be utilized so as to not etch into the planarization layer. The etchant employed may be a wet or dry etchant as known in the art. As an example, the depth and regrowth of layers 70 and 72 may be a thickness around 2,000 angstroms. Then, epitaxial growth is, again, reinitiated, i.e., the fourth epitaxial growth, comprising AWG core 73 of, for example, InGaAsP or AlInGaAs followed by deposition of NID-InP layer 75. The regrowth is taken up to the edge 79 of MOD region 65 forming optical butt coupling 71 of waveguide cores 70 and 73. An advantage of growing the waveguide core via this technique is that the waveguide core may be composed of bulk Q material (as opposed to QW material as in the embodiment of FIG. 7). As a result, the refractive index (average bandgap) and thickness of the core of the waveguide of the AWG layer are easier to control resulting in improved performance and yield of the AWG.

The fifth epitaxial growth step includes an optional NID InP stop etch layer 74, an optional Q rib-loading layer 76, a p-InP, thick confinement layer 78 and a p$^{++}$-InGaAs contact layer 80. The optional stop etch layer may also be NID AlInAs, InAlGaAs, InAlAsP or InAlGaAsP. Q rib-loading layer 76 is optional as the preferred embodiment has a ridge waveguide structure.

As in the ease of the embodiment in FIG. 11, the region of contact layer 80 and the p-InP confinement layer 73 over AWG region 67, as defined by region 78B to point or position (butt joint) 84, are etched back in regions 63 and 65 to rib-loading layer 76. This is followed by the sixth and final epitaxial growth step comprising the growth of ND-InP confinement layer 78A for the reason previously discussed in connection with the embodiment of FIGS. 7–9. This etch back alternatively can be made in AWG region 67 followed by the final epitaxial growth step comprising the growth of NID-InP confinement layer 78B forming butt joint 82 shown as a dash line in FIG. 11.

To be noted is the butt joint 84 formed between p-InP layer 78A and NID-InP layer 78B is preferably displaced longitudinally relative to butt joint 71 formed at the active/passive waveguide core 70 at MOD/AWG interface 79, i.e., they are not vertically aligned on top of one another. This separation in vertical alignment prevents double reflections of the propagating mode from the joints as occurs in the case where these butt joints are vertically aligned. As an example, the displacement of the respective butt joints 71 and 84 may be in the range of about 200 µm to about 500 µm.

In addition the butt-joint formed in FIG. 11, it is possible to couple the light emanating from the modulators via an evanescent waveguide. This evanescent waveguide may then be patterned to form a wavelength selective combiner such as an AWG.

Alternatively, a second technique to form a similar structure as described in FIG. 11 is to perform the first thru third epitaxial growths (and processing associated with them) as described above. After the third growth step, the layers 74–80 are grown in a forth growth step to complete the active devices. Subsequently, the material over the AWG region is etched and removed via a deep etch stops or extends slightly into layer 69. This is followed by a single growth from the core waveguide 73 of the AWG to the NID-InP layer 78B. This method is preferred over the previous described approach in that it requires one less regrowth and only has a single butt-joint at the AWG/MOD interface. However, this method also has disadvantages of requiring a precise deep etch prior to the AWG growth, difficult alignment of the optical Q rib-loading layers and AWG core waveguide layers across the butt-joint interface, and potential significant runaway (enhanced) growth at the butt-joint interface. Thus, careful control of processing techniques is required.

The rib loaded waveguides 69 and 71 are then formed by selective etchback of the active and passive components, as seen in FIGS. 12 and 13. A dry-etch is performed that stops at stop etch layer 74. If no stop etch layer 74 is present in the structure, the etch depth must be precisely controlled. For the ultimate optimization of performance and yield of the components on the TxPIC, it may be desirable to etch the ridges in each of the sections to different widths and depths as described previously. This may be accomplished by etching all elements to the shallowest required depth for a given element, followed by masking the element and selective etching at desired width to the desired depth. This process is repeated as many times as necessary to achieve optimal etch depths in the different elements.

Ridge waveguide performance for this and the previous embodiment for both active and passive optical components are strongly dependent on ridge height. Furthermore, the ridge sidewall angle and angle control are critical as well. The TxPIC embodiments described herein have waveguides which are curved and hence span multiple crystal planes. Consequently, it is desirable to utilize anisotropic dry etching with minimal crystallographic etching that occurs when utilizing wet etches when forming the ridge waveguides. Additionally, it is important to stop, at a precise depth, when defining the ridge waveguides in order to control the mode size, and hence optical confinement in the waveguides. This is typically accomplished via stop etch layer 42 and 74, such as, for example, InGaAsP, that is used in conjunction with a wet etch. However, in the case of the embodiments here, the routing of the waveguides in, out and through the multiplexer, such as in the case of an AWG, requires the waveguides to bend and thus span multiple crystal planes. Virtually all wet etches have some crystallographic dependence, making the employment of such an etching method, as applied to a TxPIC chip described herein, unpractical because the resulting ridge waveguides will vary in width across the chip. Thus, a stop etch layer that facilitates an etch stop with dry etching will significantly improve the control and reproducibility of the process. Potential stop etch layers 42 and 74 for dry etching, e.g., $CH_4/H_2$, are InAlAs, InAlGaAs, InAlAsP and InAlGaAsP. The key in all of these stop etch layers is to have as high an Al content as possible. Furthermore, additional P to the Al-bearing stop etch compound should further improve etch selectively (or stopping power). It is not required for the stop etch layer to be lattice matched (e.g., tensile strained InAlAs with higher Al composition than lattice matched InAlAs is preferred).

As previously discussed, the ridge waveguide is desired so the propagating mode in the various waveguide paths formed on the TxPIC chip experience lower confinement which enhances the intensity output from the DFB and MOD, helping to eliminate the need for providing any on-chip amplification, such as SOAs.

Distinctive advantages of employing a waveguide core butt joint 71, as shown in FIG. 11, is that this joint permits higher performance (e.g., power output, chirp, extinction ration and insertion loss) from the DFB/MOD regions 63 and 65 since there is better control in achieving the desired strain for MOD region 65. Also, in deploying a separate epitaxial growth for AWG region 67, the Q waveguide cores 71 formed in the AWG region will have a more uniform bandgap and allow independence and flexibility in the design and growth of the DFB quantum well active region formed in separate core waveguide 70. While such butt joints do have a certain amount of insertion loss due to light reflections and scattering at the joint, careful control of the epitaxial growth processes can maintain these losses low.

As a still further note, the use of the Q comprising InAlGaAs in the active region/waveguide core 40 and 70 in TxPICs 30 and 60 formed via SAG processing across the TxPIC chip, in lieu of InGaAsP, provides for better bandgap uniformity, a better DFB laser due to better optical confinement and better modulator performance due to reduced hole "pile-up" in the valence band. The better uniformity of InAlGaAs is achieved principally due to the lack of P in the quaternary compound. The cracking temperature of $PH_3$ is sufficiently different than other constituents for this quaternary in the MOCVD process that it is difficult to achieve high compound uniformity of InGaAsP particularly over a large surface area. Also, such an Al-bearing layer provides for increased interface abruptness of the quantum well interfaces.

Also, it is within the scope of the embodiment of FIGS. 11–13 that InAlGaAs active/passive waveguide core 70 be initially grown across the DFB/MOD/AWG regions while the waveguide core 73 of AWG region 67 be etched and then regrown as InGaAsP or InAlGaAs. The layers grown sequentially in AWG region 67 are preferably bulk layers, i.e. an AlInGaAs layer, in lieu of multiple Q quantum well and barrier layers, to minimize any non-uniformity induced by quantum-size effects.

It should be noted that in connection with EA modulators in MOD regions 26 and 65 in the two discussed embodiments, at least a double quantum well stack (e.g., double quantum well with n number of repeats) is one approach to achieving high performance operation. For long optical transmission spans, a TxPIC chip with EA modulators that possess negative chip, low insertion loss and high extinction ratio is desired. In order to realize this with the full SAG processing of a TxPIC (while maintaining the constraints imposed by the SAG budget), a double-quantum well structure is preferred for the EA modulator. Preferably, the active region of the EA modulators includes at least two different regions where the potential well of a first region is deeper than that of a second region. This preference arises from the fact that it is not possible to achieve the requisite tensile stain in the modulator region for optimal performance in a single well structure for a TxPIC chip with full SAG processing of the active/passive waveguide. The double well structure provides the ability to achieve good negative chirp characteristics, extinction ratio, and insertion loss without the utilization of significant strain (e.g., $<+/-2000$ ppm strain). Each of these regions can be a composite of several layers, i.e., pairs of quantum wells and barriers, but a key factor is that the average electron potential of the first region should be less than that of the second region. Generally, also the thickness of the first region is greater than or equal to that of the second region, although in all of the embodiments to be discussed, which are shown in FIGS. 14A–14H, the thickness is shown to be greater in the first region. FIGS. 14A to 14H illustrate the valence band for various combinations of such first and second region active regions. The Q material regime is InGaAsP or AlInGaAs.

As shown in FIG. 14A, modulator stepped quantum well region 90 comprises a first step 91 and a second step 92 where the potential well of the first step 91 is deeper than the potential well of the second step 92, and the thickness of the first step 91 is greater than the thickness of the second step 92. The quantum well steps 91 and 92 may be separated by a barrier 93, as shown in dotted outline at 93 in FIG. 14A, which may also be multiple barrier layers instead of one barrier. Barrier 93 provides for delineation between the two well steps 91 and 92 to help confine the electron or hole in either well step of the dual well step structure where the peak of the probability density function shifts from the first step region to the second step region of the structure upon application of a reverse bias. This is true for the barrier or barriers illustrated in each of the remaining FIGS. 14B–14H.

In FIG. 14B, modulator stepped quantum well region 94 comprises a first quantum well step 95 and a second quantum well step 96 where the latter is graded and the former is flat. A barrier layer 96 may be formed between well steps 95 and 96.

In FIG. 14C, in modulator stepped quantum well region 98, both well steps 99A and 99B are index graded with a vertical step 100 provided between the well steps. A barrier layer 96 may be formed between wells 99A and 99B. The well step 99A is thicker and deeper than well step 99B.

In FIG. 14D, modulator stepped quantum well region 102 comprises a first well step 103 and a second well step 104 where the first well step 103 is graded and the second well step 104 is flat. A barrier layer 105 may be provided between well steps 103 and 104.

In FIG. 14E, modulator stepped quantum well region 106 comprises a first well step 107 and a second well step 108 where the well steps are both graded with the first well step 107 being deeper and equal to or thicker than the second well step 108. A barrier layer 109 may be provided between well steps 107 and 108.

In FIG. 14F, modulator stepped quantum well region 110 comprises a first well step 111 and a second well step 112 where both well steps are at the same well potential with the first well step 111 being thicker than the second well step 112. Also, a barrier layer 110 is provided between well steps 111 and 112.

The modulator quantum well region 114 in FIG. 14G is similar to that in FIG. 14F except that the well potentials are not the same. Modulator stepped quantum well region 114 comprises a first well step 115 and a second well step 117 where the first well step 115 has a deeper well potential than the second well step 116 and, also, the first well step 115 is thicker than the second well step 116. Also, a barrier layer 117 is provided between well steps 115 and 116.

In FIG. 14H, modulator stepped quantum well region 118 comprises a first well step region 119 having a plurality of bandgap steps 122 and a second well step region 120 having a plurality of bandgap steps 123. The steps in regions 119 and 120 increase monotonically where first step region 119 is thicker than the step region 120 and, further, has on average a lower conduction band energy for region 119. Also, one or more barriers 124 and 125 may be provided at the edge of well steps 123 of the second well step region 120 as illustrated in FIG. 14H.

It should be noted that there are many possible alternative configurations and these illustrations in FIGS. 14A–14H illustrate just a few. A key point is that the active region includes at least different regions in a stepped quantum well where the potential well of a first step or region is deeper than that of a second step or region where the average electron potential of the first step or region should be less than that of the second step or region. The stepped quantum well active region advantageously requires a lower applied electric field to split the electron-hole exciton as well as providing negative chirp with high extinction ratio and minimized insertion loss compared to a single well active region.

It should be noted that additional multiple well steps can be formed in each of the two steps or regions of the embodiments of FIGS. 14A–14G as is illustrated in FIG. 14H.

A complex-coupled grating structure in the DFB arrays, as previously described, may be used in conjunction with the ridge-waveguide PIC structures described herein. A complex-coupled grating structure is provides more enhanced stability for high-power operation and is more immune to back reflections from within the TxPIC. This may be used advantageously with the TxPIC ridge waveguide structures described herein where different ridge widths or heights are utilized for various elements in the PIC. These different ridge widths and heights create an index step between elements which causes back reflection of the propagating light to the DFB. Similarly, the butt-joint(s) of the devices described in FIGS. 7 and 11 also cause back reflections. The complex-coupled grating DFB is more immune to these back reflections, and thus, further facilitates high power operation. Also, the complex-coupled grating may be used in conjunction with a directly modulated laser, as in FIG. 1, to achieve high power and improved chirp characteristics.

The utilization of complex-coupled gratings facilitates a high-performance EML structure that utilizes an identical active layer (IAL) approach. The IAL approach may also be deployed with a band-edge Mach-Zehnder modulator structures. Such IAL approaches are known in the art. See, for example the article of R. A. Salvatore et al, "Electroabsorption Modulated Laser For Long Transmission Spans", *IEEE Journal of Quantum Electronics*, Vol. 38(5), pp. 464–476, May, 2002,. Such structures may be utilized advantageously in the TxPIC disclosed herein. The IAL EML does not require any bandgap shift between the laser and the modulator. Thus, the SAG budget is effectively improved for the TxPIC structures of either FIGS. 7 or 11. In this structure, the only SAG that is required is to tune the bandgap from channel to channel. This requires the least amount of SAG (typically around 15 to 30 nm). As a result of the small amount of SAG processing required, the uniformity of the composition and thickness of the material in the SAG regions (the IAL elements) may be significantly improved, yielding improved yields. Furthermore, the complex-coupled grating structure in combination with a ridge-waveguide structure facilitates high-power operation. Note that unlike that described in the above mentioned article of R. A. Salvatore et al., the ridge structure in the modulator in the approach here may be either a deep ridge or a shallow ridge. A deep-ridge is preferred for improved manufacturability and reduced bias voltage, but provides increased back reflection to the DFB. Furthermore, the AWG region may be either a deep or shallow ridge.

The complex coupling allows the greatest degree of design freedom for the ridge structures while being the most immune to back reflection. The IAL approach may also be used in conjunction with the full SAG approach. In this approach, the IAL approach reduces the SAG budget by about 50 nm. This facilitates a wider process window for the SAG growth as well as allowing for improved uniformity as the reduced SAG shift may provide better composition and thickness uniformity.

Note that other selective bandgap shifting techniques may also be employed to vary the wavelength across any of the elements in the PIC. These may be substituted or utilized in conjunction with any of the aforementioned SAG processing steps. These selective bandgap shifting techniques include disordering (also known as layer intermixing) or multiple regrowths (forming butt joints across the array or along a single channel). Disordering may be implemented by a variety of methods, including impurity-induced layer disordering, vacancy-enhanced layer disordering, or implantation (defect) enhanced layer disordering. If disordering is employed in the AWG or optical combiner region, it is preferably does not introduce significant impurities into the materials that form optical waveguides. This preference is dictated by the fact that impurities can act as optical absorption centers, increasing the propagation loss in the passive structure. Furthermore, care must be taken to ensure that dislocations are not introduced in the PIC materials during the disordering process, resulting in degraded performance and reliability. Note that any of the aforementioned bandgap shifting techniques may be used solely or in concert with each other throughout this invention. Specifically, these bandgap shifting techniques may be utilized in the devices of FIGS. 1, 7, and 11 as well as in conjunction with any IAL structure in a TxPIC.

Correctly targeting and maintaining the uniformity of the composition and thickness of the material in the DFB and MOD regions is essential to the performance and yield of the TxPIC. The utilization of any selective bandgap shifting technique, including SAG, introduces further error and uncertainty in the composition and thickness uniformity. Thus, it is most desirable to only shift the bandgap of the least number of elements in a TxPIC. The wavelength of the DFB is significantly affected by the grating pitch and stripe width. Furthermore, the window of acceptable operation of an EA modulator is typically on the order of about 5 to 10 nm. Thus, for a TxPIC, it is not necessary to shift every channel with a bandgap shifting technique. Therefore, an embodiment of this invention is to only shift the composition and/or thickness every $i^{th}$ element in the PIC, wherein i>1. In such cases for the DFB lasers, a shift in the wavelength is still accomplished with a composition and/or thickness shift every $i^{th}$ laser.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A monolithic photonic integrated circuit (PIC) chip comprising:
    an array of modulated sources, forming an active waveguide structure comprising a plurality of first waveguides and providing a plurality of channel signals of different wavelengths;
    an optical combiner forming a passive waveguide structure comprising a plurality of second waveguides and coupled to receive the channel signals and produce a combined output of the channel signals;
    all of said first and second waveguides are formed as ridge waveguides to enhance the output power from the circuit so that the average output power from the circuit is approximately 2 to 4 times higher than in the case where the circuit partially includes buried heterostructure (BH) waveguides.

2. The monolithic photonic integrated circuit (PIC) chip of claim 1 wherein the ridge waveguide comprise a rib-loaded waveguide.

3. The monolithic photonic integrated circuit (PIC) chip of claim 1 wherein the modulated sources are comprised of distributed feedback (DFB) laser sources or distributed Bragg reflector (DBR) laser sources and electro-optic modulators.

4. The monolithic photonic integrated circuit (PIC) chip of claim 1 wherein an active region of each of the modulated sources comprises either InGaAsP or InAlGaAs.

5. The monolithic photonic integrated circuit (PIC) chip of claim 1 wherein the modulated sources are distributed feedback (DFB) lasers formed on an InP chip comprising an InP substrate upon which is deposited a grating layer of either InGaAsP or InAlGaAs, an active region of either InGaAsP or InAlGaAs, a stop etch layer of InP, and a ridge waveguide layer and a confinement layer of InP.

6. The monolithic photonic integrated circuit (PIC) of claim 5 wherein the ridge waveguides comprise a rib-loaded waveguide of either InGaAsP or InAlGaAs.

7. A monolithic photonic integrated circuit (PIC) comprising:
    an array of modulated sources, each source being formed of a ridge waveguide and having an output wavelength at a designated wavelength on a wavelength transmission grid; and
    an optical combiner coupled to receive and produce a multiplexed output of the modulated output wavelengths from said modulated sources, the optical combiner including a plurality of waveguides that are also ridge waveguides so that the circuit is formed of ridge waveguides.

8. The monolithic photonic integrated circuit (PIC) of claim 7 wherein the modulated sources are one of distributed feedback (DFB) lasers, distributed Bragg reflector (DBR) lasers, distributed feedback (DFB) plus electro-absorption modulators, DBR lasers plus electro-absorption modulators, distributed feedback (DFB) lasers plus Mach-Zehnder modulators, or distributed Bragg reflector (DBR) lasers plus Mach-Zehnder modulators.

9. The monolithic photonic integrated circuit (PIC) of claim 7 wherein the optical combiner is an arrayed waveguide grating (AWG).

10. The monolithic photonic integrated circuit (PIC) of claim 7 wherein the ridge waveguides are of different widths or heights in at least two different elements on the PIC to improve performance.

11. The monolithic photonic integrated circuit (PIC) of claim 7 wherein the modulated sources include distributed feedback (DFB) lasers wherein active regions of said modulated sources are complex coupled.

12. The monolithic photonic integrated circuit (PIC) of claim 7 wherein the ridge waveguides are rib-loaded waveguides.

13. A monolithic photonic integrated circuit (PIC) comprising:
    an array of laser sources, the laser sources each having an active region with a selected bandgap providing a cw output wavelength at a designated wavelength on a wavelength transmission grid;
    an array of electro-optic modulators, one for each of the laser source output wavelengths to provide a modulated signal on each respective output wavelength, each of the modulators having an active region having a bandgap larger than the bandgap of a corresponding laser source;
    an arrayed waveguide grating coupled to receive and produce a multiplexed output of the modulated output wavelengths, the arrayed waveguide grating including a plurality of waveguides having a bandgap larger than any of the bandgaps of the electro-optic modulators;
    the output of the arrayed waveguide grating coupled for transmission on an optical link.

14. A monolithic photonic integrated circuit (PIC) comprising:
    an epitaxial growth comprising:
        an active region for an array of laser sources with a selected bandgap providing a cw output wavelength at a designated wavelength on a wavelength transmission grid;
        an active region for an array of electra-optic modulators, each optically coupled to a laser source and having a bandgap larger than the bandgap of its corresponding laser source;
        the arrays grown by employing selective area growth (SAG) within a SAG budget providing operational wavelengths within the wavelength transmission grid;
    another epitaxial growth comprising:
        a core waveguides for an arrayed waveguide grating having a larger bandgap than the bandgap of the active regions of the arrays which may be either inside or outside the SAG budget for operational wavelengths of the rays.

15. A monolithic photonic integrated circuit (PIC) having a plurality of active and passive elements, comprising:
    an array of distributed feedback (DFB) sources, the DFB sources each having an active region with a selected bandgap providing a cw wavelength output at a designated wavelength on a wavelength transmission grid, each DFB source being complex-coupled;
    an array of electro-optic modulators, one for each of said DFB sources and providing a modulated signal on each respective output wavelength, each of the modulators having an active region with identical bandgap to the bandgap of its corresponding source;

the distributed feedback (DFB) source/modulator pairs formed in a plurality of waveguides; and an optical combiner coupled to receive the modulated signals from the distributed feedback (DFB) source/modulator output waveguides and produce a multiplexed output of the modulated signals;

the optical combiner further comprising a plurality of waveguides having a bandgap larger than any of the bandgaps of the electro-optic modulators; and the output of the arrayed waveguide grating coupled for transmission on an optical link.

16. The monolithic photonic integrated circuit (PIC) of claim 15 wherein the optical combiner comprises an arrayed waveguide grating (AWG).

17. The monolithic photonic integrated circuit (PIC) of claim 15 wherein all of the waveguides in the PIC are all ridge waveguides.

18. The monolithic photonic integrated circuit (PIC) of claim 17 wherein waveguides in the PIC have different widths or heights for at least two different elements of the PIC.

19. A monolithic photonic integrated circuit (PIC) chip comprising an array of distributed feedback (DFB) lasers each providing an output at a designated wavelength on a wavelength transmission grid, each of the DFB laser outputs coupled to an input of an arrayed waveguide grating (AWG) and providing an output comprising multiplexed outputs from the DFB lasers, the DFB lasers and the AWG all formed as ridge waveguide structures.

20. The monolithic photonic integrated circuit (PIC) of claim 19 wherein the DFB lasers are direct modulated to provide a multiplexed output of modulated signals.

21. The monolithic photonic integrated circuit (PIC) of claim 19 wherein the DFB lasers are complex coupled active regions.

22. The monolithic photonic integrated circuit (PIC) chip of claim 19 wherein the ridge waveguide structures are rib-loaded waveguide structures.

23. The monolithic photonic integrated circuit (PIC) of claim 19 wherein the cross-sectional width of the ridge waveguides in the region of the DFB lasers are narrower than the cross-sectional width of the ridge waveguides in the region of the AWG.

24. The monolithic photonic integrated circuit (PIC) of claim 19 wherein DFB lasers are provided with active regions having complex-coupled gratings with multiple quantum wells.

25. The monolithic photonic integrated circuit (PIC) of claim 19 wherein the DFB lasers are provided with active regions comprising a plurality of quantum wells and barriers.

26. The monolithic photonic integrated circuit (PIC) of claim 19 wherein the DFB lasers have an action region comprising InGaAsP or InAlGaAs.

27. A monolithic photonic integrated circuit (PIC) chip comprising:

an array of distributed feedback (DFB) lasers each providing an output at a designated wavelength and together approximating a wavelength transmission grid;

each of the DFB laser outputs optically coupled to a corresponding electro-absorption (EA) modulator;

outputs of the EA modulators coupled to an input of an arrayed waveguide grating (AWG) which has an output comprising multiplexed, modulated outputs from the EA modulators;

the DFB lasers, EA modulators and the AWG all formed as ridge waveguide to enhance the mode intensity at the outputs of the EA modulators.

28. The monolithic photonic integrated circuit (PIC) chip of claim 27 wherein the ridge waveguides are rib-loaded waveguides.

29. The monolithic photonic integrated circuit (PIC) chip of claim 27 wherein the ridge waveguides in regions of the DFB lasers have a different width than the ridge waveguide structures in regions of the EA modulators.

30. The monolithic photonic integrated circuit (PIC) chip of claim 27 wherein the ridge waveguides in regions of the DFB lasers have a narrower width than the ridge waveguide structures in regions of the EA modulators.

31. The monolithic photonic integrated circuit (PIC) chip of claim 27 wherein the ridge waveguides in regions of the DFB lasers have a different profile or height than the ridge waveguide structures in regions of the EA modulators.

32. The monolithic photonic integrated circuit (PIC) chip of claim 27 wherein active and waveguide regions of the chip DFB lasers, EA modulators and the AWG are formed employing SAG processing, alloy disordering or multiple regrowths.

33. The monolithic photonic integrated circuit (PIC) chip of claim 27 wherein active and waveguide regions of the chip DFB lasers, EA modulators and the AWG comprise InGaAsP or InAlGaAs.

34. A monolithic photonic integrated circuit (PIC) chip comprising an array of distributed feedback (DFB) lasers providing output at a designated wavelength on a wavelength transmission grid, each of the outputs optically coupled to a corresponding electra-absorption (EA) modulator, the EA modulators having a quantum well active region with an interstep barrier in the region.

35. The monolithic photonic integrated circuit (PIC) chip of claim 34 wherein said interstep barrier is between two potential well steps of different potential.

36. The monolithic photonic integrated circuit (PIC) chip of claim 34 wherein the interstep barrier is in a multiple well step where each step is at a different well potential.

37. The monolithic photonic integrated circuit (PIC) chip of claim 36 wherein the multiple well step comprises at least two steps.

38. The monolithic photonic integrated circuit (PIC) chip of claim 34 wherein there are plural barriers in a multiple well step where each step is at a different well potential.

39. The monolithic photonic integrated circuit (PIC) chip of claim 38 wherein the multiple well step comprises several steps.

40. A monolithic photonic integrated circuit (PIC) chip comprising an array of distributed feedback (DFB) lasers providing output at a designated wavelength on a wavelength transmission grid, each of the outputs optically coupled to a corresponding electro-absorption (EA) modulator, the EA modulators having a quantum well stepped region comprising at least two well steps of different well depth providing negative chirp with high extinction ratio and minimized insertion loss compared to deployment of a single quantum well region having a similar strain.

41. The monolithic photonic integrated circuit (PIC) chip of claim 40 further comprising a barrier formed between the at least two well steps.

42. A monolithic photonic integrated circuit (PIC) chip comprising at least one EA modulator having multiple stepped quantum well active region having at least two different potential wells where the electron-hole exciton splits at a lower applied electric field compared to a single well active region.

43. The monolithic photonic integrated circuit (PIC) chip of claim 42 wherein the multiple stepped quantum well active region comprises at least two quantum well steps of different well depth.

44. The monolithic photonic integrated circuit (PIC) chip of claim 43 wherein one of the quantum well steps is graded.

45. The monolithic photonic integrated circuit (PIC) chip of claim 43 wherein one of the quantum well steps includes at least one additional smaller step.

46. The monolithic photonic integrated circuit (PIC) chip of claim 43 wherein at least one barrier layer is provided between the at least two quantum well steps.

* * * * *